(12) United States Patent
Yu et al.

(10) Patent No.: US 8,645,902 B1
(45) Date of Patent: Feb. 4, 2014

(54) METHODS, SYSTEMS, AND COMPUTER PROGRAM PRODUCTS FOR IMPLEMENTING INTERACTIVE COLORING OF PHYSICAL DESIGN COMPONENTS IN A PHYSICAL ELECTRONIC DESIGN WITH MULTIPLE-PATTERNING TECHNIQUES AWARENESS

(75) Inventors: Henry Yu, Palo Alto, CA (US); Jeffrey Markham, San Jose, CA (US); Min Cao, San Ramon, CA (US); Roland Ruehl, San Carlos, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 13/445,847

(22) Filed: Apr. 12, 2012

Related U.S. Application Data

(60) Provisional application No. 61/582,214, filed on Dec. 30, 2011.

(51) Int. Cl.
*G06F 17/50* (2006.01)
*G06F 15/04* (2006.01)

(52) U.S. Cl.
USPC .......................................... 716/139; 716/55

(58) Field of Classification Search
USPC .................................................. 716/55, 139
See application file for complete search history.

(56) References Cited

U.S. PATENT DOCUMENTS

| | | | |
|---|---|---|---|
| 8,028,259 B2 | 9/2011 | Vogel | |
| 8,176,445 B1 * | 5/2012 | Qian | 716/52 |
| 8,381,153 B2 * | 2/2013 | Chiang et al. | 716/110 |
| 8,397,194 B2 * | 3/2013 | Uppaluri et al. | 716/107 |
| 8,516,404 B1 * | 8/2013 | Cao et al. | 716/52 |
| 2003/0229860 A1 | 12/2003 | Li | |
| 2004/0068708 A1 | 4/2004 | Sivaraman et al. | |
| 2005/0221201 A1 * | 10/2005 | Ellis | 430/5 |
| 2005/0268258 A1 | 12/2005 | Decker | |
| 2006/0200789 A1 * | 9/2006 | Rittman | 716/19 |
| 2006/0259882 A1 * | 11/2006 | Lin et al. | 716/5 |
| 2007/0148794 A1 | 6/2007 | Cha et al. | |
| 2008/0005713 A1 | 1/2008 | Singh et al. | |
| 2008/0178140 A1 | 7/2008 | Lin et al. | |
| 2008/0184183 A1 | 7/2008 | Kobayashi | |
| 2008/0250361 A1 | 10/2008 | Bae et al. | |

(Continued)

OTHER PUBLICATIONS

Amendment After Non-Final Rejection dated Apr. 16, 2013, for U.S. Appl. No. 13/445,860.

(Continued)

*Primary Examiner* — Stacy Whitmore
*Assistant Examiner* — Magid Dimyan
(74) *Attorney, Agent, or Firm* — Vista IP Law Group, LLP

(57) ABSTRACT

Various embodiments provide a constraint-driven environment to interactively determine coloring of layout components when the layout components are being modified or created and to provide feedback with visual aids to users in nearly real-time. Layout components are thus appropriately assigned to respective mask designs upon their creation. Various embodiments check or verify various constraints during creation or modification of layout components, and the layout thus remains design rule clean as constructed. Some embodiments use data structure(s) including information associated with mask identifications of objects of a cluster to change some mask identifications without considering any of the constraints governing these mask identifications. Some embodiments further determine the mask identification for an object based at least in part on whether object splitting and stitching is permitted.

37 Claims, 18 Drawing Sheets

(56) References Cited

U.S. PATENT DOCUMENTS

| | | |
|---|---|---|
| 2009/0037852 A1 | 2/2009 | Kobayashi et al. |
| 2009/0083689 A1 | 3/2009 | Ringe et al. |
| 2009/0150850 A1* | 6/2009 | Sinha et al. ............. 716/19 |
| 2009/0254814 A1 | 10/2009 | Lai et al. |
| 2009/0276735 A1 | 11/2009 | Kramer et al. |
| 2009/0313596 A1* | 12/2009 | Lippmann et al. .......... 716/12 |
| 2010/0162151 A1 | 6/2010 | Class et al. |
| 2010/0229140 A1 | 9/2010 | Strolenberg et al. |
| 2010/0257498 A1 | 10/2010 | Alpert et al. |
| 2011/0219341 A1 | 9/2011 | Cao et al. |
| 2012/0023468 A1 | 1/2012 | Fischer et al. |
| 2012/0023470 A1 | 1/2012 | Nakagawa |
| 2012/0023471 A1 | 1/2012 | Fischer et al. |
| 2012/0185811 A1 | 7/2012 | Ramachandran et al. |
| 2012/0254818 A1 | 10/2012 | Liu et al. |
| 2013/0031521 A1 | 1/2013 | Teoh |
| 2013/0086542 A1 | 4/2013 | Teoh et al. |

OTHER PUBLICATIONS

Amendment After Non-Final Rejection dated Apr. 16, 2013, for U.S. Appl. No. 13/445,874.

Non-Final Office Action dated Jan. 3, 2013 for U.S. Appl. No. 13/445,832.

Non-Final Office Action dated Jun. 5, 2013, for U.S. Appl. No. 13/445,874.

Notice of Allowance dated Jun. 5, 2013 for U.S. Appl. No. 13/445,832.

Final Office Action dated Jun. 14, 2013, for U.S. Appl. No. 13/445,860.

Non-Final Office Action dated Jan. 16, 2013 for U.S. Appl. No. 13/445,860.

Non-Final Office Action dated Jan. 16, 2013 for U.S. Appl. No. 13/445,874.

Notice of Allowance dated Nov. 22, 2013 for U.S. Appl. No. 13/445,874.

* cited by examiner

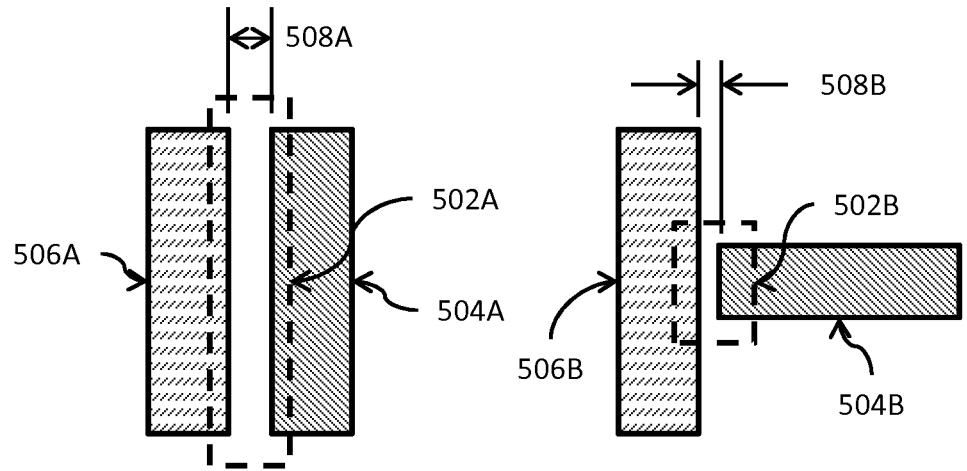
FIG. 5A
FIG. 5B
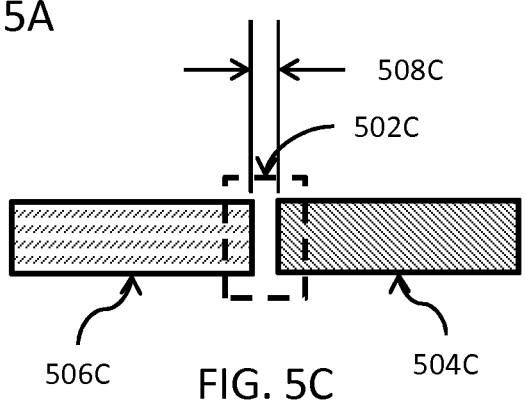
FIG. 5C
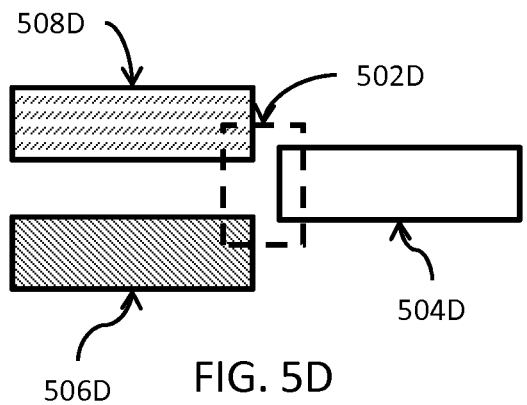
FIG. 5D

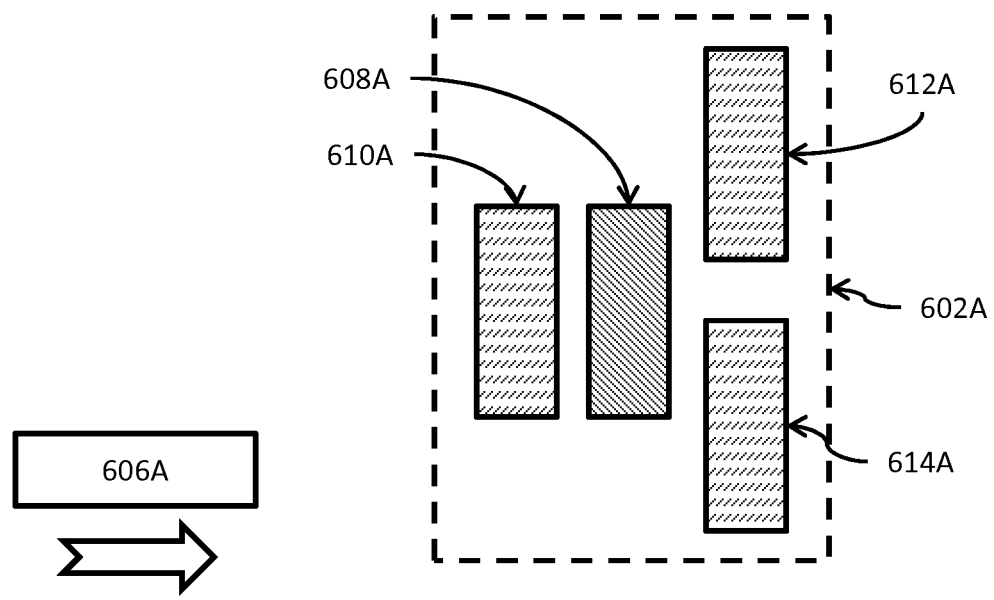
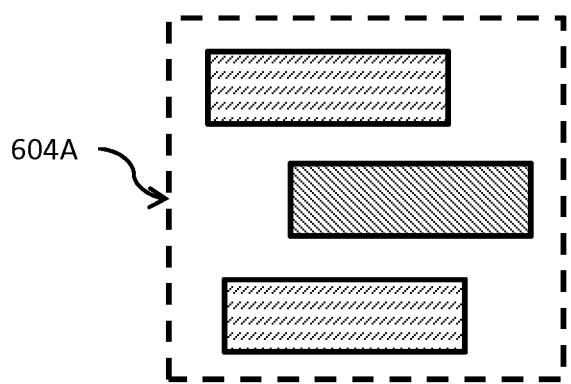
FIG. 6A

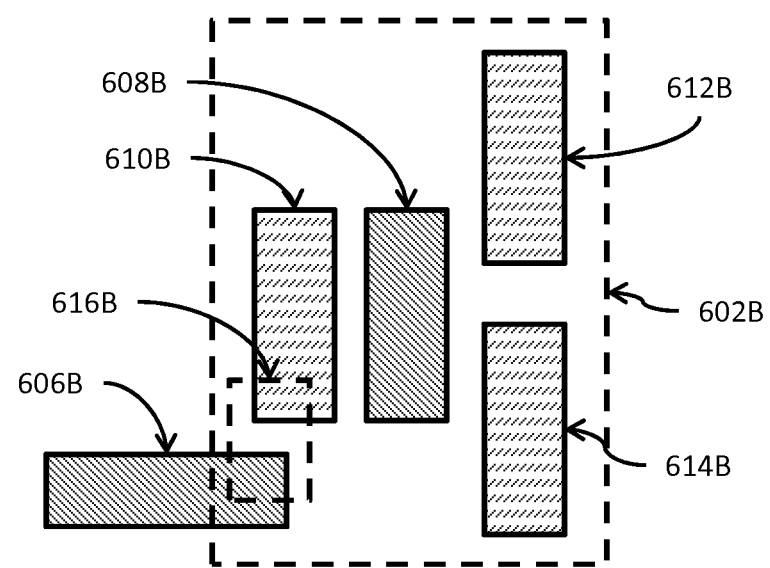
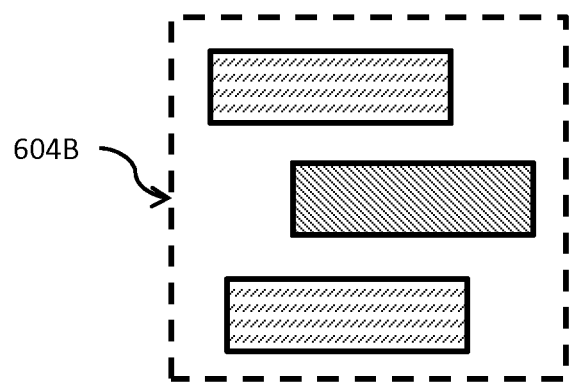
FIG. 6B

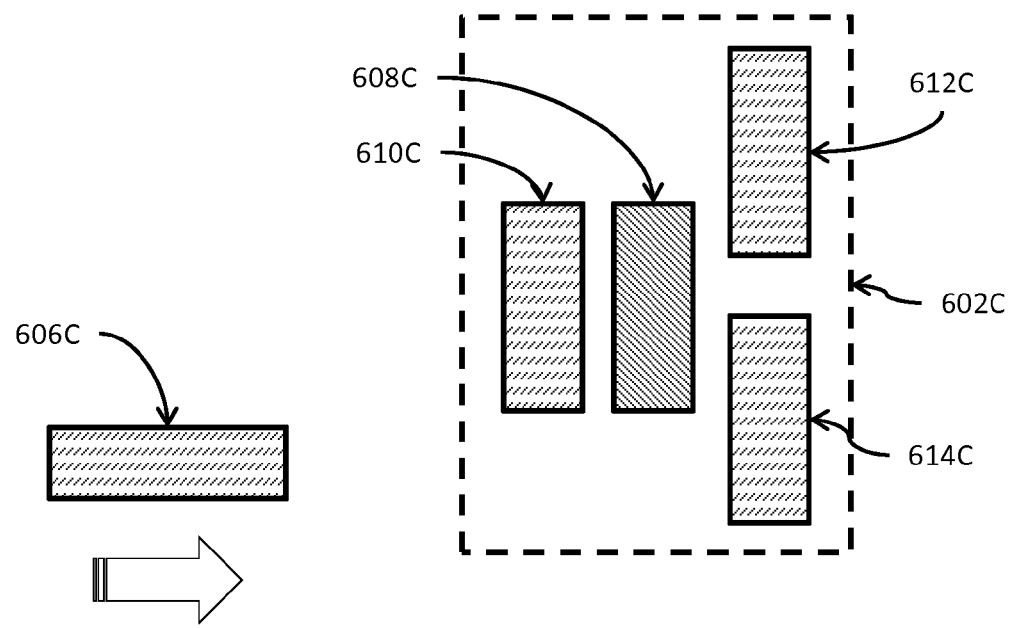
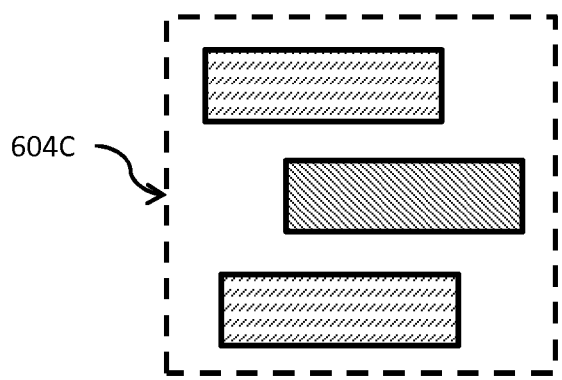
FIG. 6C

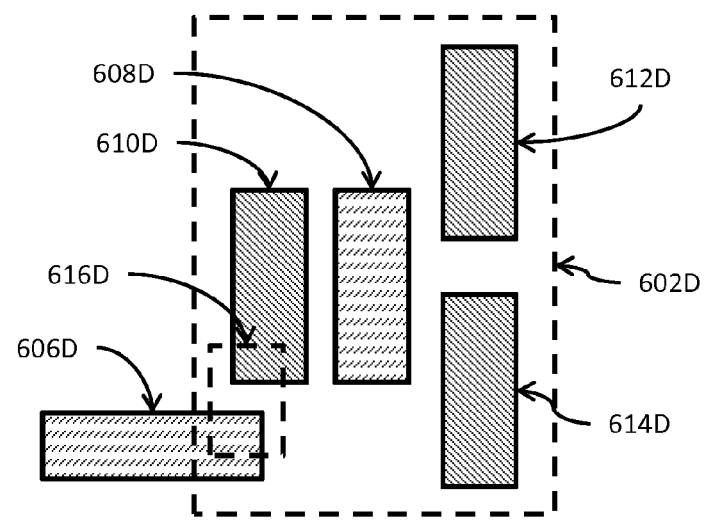
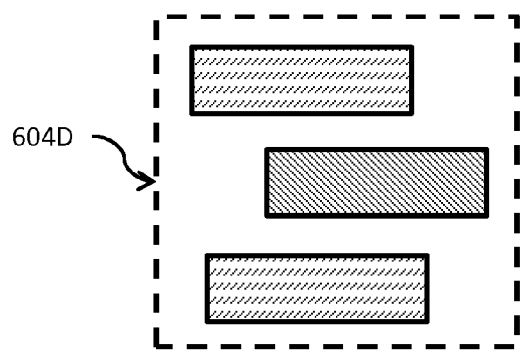
FIG. 6D

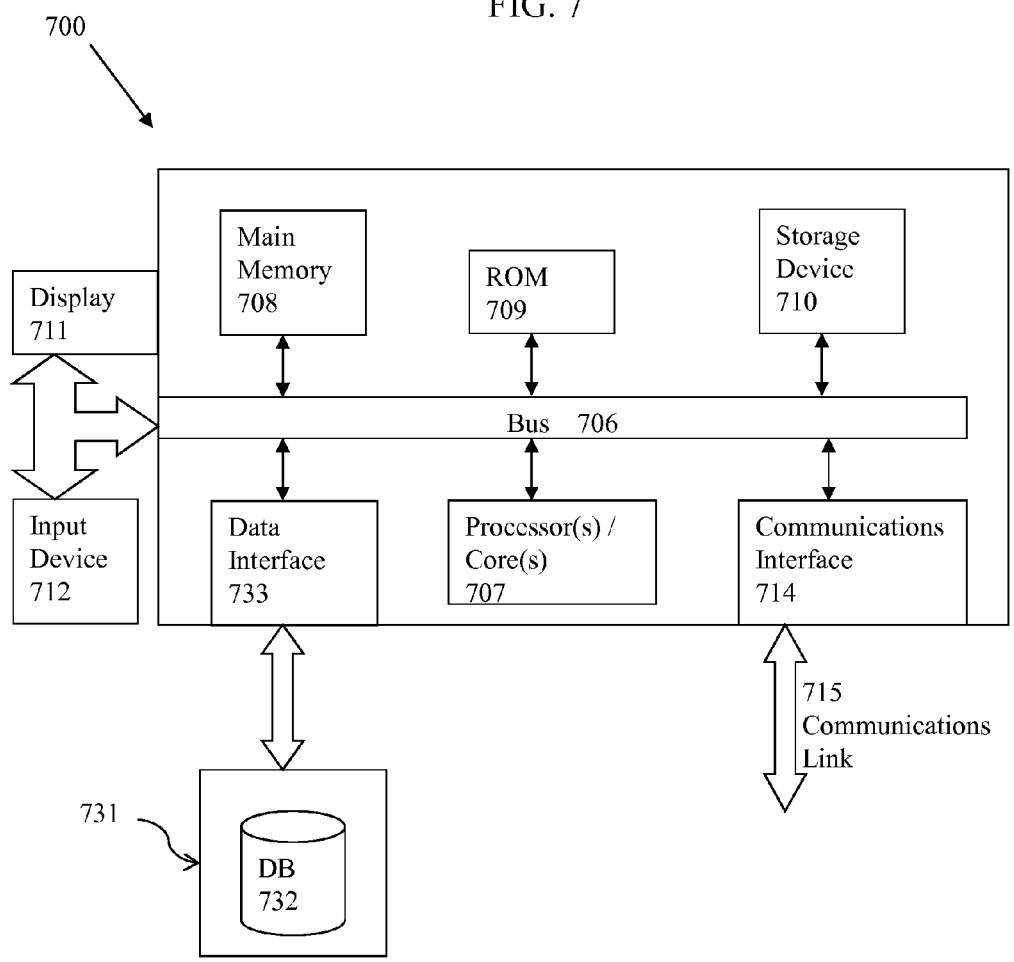

METHODS, SYSTEMS, AND COMPUTER PROGRAM PRODUCTS FOR IMPLEMENTING INTERACTIVE COLORING OF PHYSICAL DESIGN COMPONENTS IN A PHYSICAL ELECTRONIC DESIGN WITH MULTIPLE-PATTERNING TECHNIQUES AWARENESS

CROSS-REFERENCE TO RELATED APPLICATION(S)

This application claims the benefit of U.S. Provisional Patent App. Ser. No. 61/582,214, filed on Dec. 30, 2011 and entitled "METHODS, SYSTEMS, AND COMPUTER PROGRAM PRODUCTS FOR IMPLEMENTING INTERACTIVE COLORING OF PHYSICAL DESIGN COMPONENTS IN A PHYSICAL ELECTRONIC DESIGN WITH MULTIPLE-PATTERNING TECHNIQUES AWARENESS". The content of the U.S. Provisional Patent Application is hereby expressly incorporated by reference in its entirety for all purposes. This application is cross-related to U.S. patent application Ser. No. 13/445,832, filed concurrently with the title "METHODS, SYSTEMS, AND ARTICLES OF MANUFACTURE FOR IMPLEMENTING A PHYSICAL DESIGN OF AN ELECTRONIC CIRCUIT WITH AUTOMATIC SNAPPING", U.S. patent application Ser. No. 13/445,860, filed concurrently with the title "METHODS, SYSTEMS, AND ARTICLES OF MANUFACTURE FOR IMPLEMENTING INTERACTIVE, REAL-TIME CHECKING OR VERIFICATION OF COMPLEX CONSTRAINTS", and U.S. patent application Ser. No. 13/445,874, filed concurrently with the title "METHODS, SYSTEMS, AND COMPUTER PROGRAM PRODUCT FOR IMPLEMENTING ELECTRONIC DESIGNS WITH CONNECTIVITY AND CONSTRAINT AWARENESS". The content of the aforementioned applications is hereby expressly incorporated by reference in its entirety for all purposes. In addition, this application is cross related to U.S. patent application Ser. No. 12/719,710 filed on Mar. 8, 2010 and entitled "METHOD, SYSTEM, AND PROGRAM PRODUCT FOR INTERACTIVE CHECKING FOR DOUBLE PATTERN LITHOGRAPHY VIOLATIONS". The content of this U.S. patent application is hereby expressly incorporated by reference in its entirety for all purposes.

BACKGROUND

Conventional electronic design process proceeds sequentially through a schematic design stage to determine the schematic design of an electronic design, a physical design stage to construct the layout of the electronic design, and a verification stage at which various verification processes, such as design rule checking and physical verification, are performed to determine whether the electronic design complies with certain set of constraints, design rules, requirements, or goals (collectively constraints.) Nonetheless, any violations identified during the verification stage may require a costly and often time-consuming process to resolve such violations. For example, a layout designer may have to return to the physical design to move certain shapes or to reroute certain interconnects in order to satisfy a spacing constraint and re-submit the revised electronic design to the verification modules or design rule check engines to determine whether the revised electronic design satisfies the prescribed constraints or design rules. As a result, the electronic design process may involve an iterative process where designers loop among various stages of the process, hoping that the electronic design may be finally signed off for tapeout. In addition, a layout designer often does not know whether any portion of the layout violates certain constraints until the layout is complete and ready for verification. The advent of more complex design rules simply exacerbates the problems.

The recent advances in very deep sub-micron (VDSM) integrated circuits (ICs) have exacerbated the issues in the physical design methodology process of electronic circuits. For example, most conventional electronic circuit design tools focus on post-layout verification of the power grid or interconnects when the entire chip design is complete and detailed information about the parasitics of the physical designs and the currents drawn by the transistors are known. In these conventional approaches, the conventional circuit synthesis step is followed by layout synthesis and each step is carried out independent of the other. This is again followed by a physical or formal verification step upon the completion of the entire physical layout to check whether the desired performance goals have been achieved after layout generation and extraction. These steps are carried out iteratively in the conventional approaches till the desired performance goals are met. Nonetheless, such an iterative approach wastes significant amount of resources because various physical design tools, such as the placement tool, the router, etc., and various schematic design tools, such as the schematic editor, the schematic level simulator(s), etc., are unaware of the electrical parasitics associated with the physical data of the design and the electrical characteristics associated with the electrical parasitics.

Therefore, there exists a need for providing a method, a system, and an article of manufacture for implementing interactive coloring of physical design components in a physical electronic design with multiple-patterning techniques awareness.

SUMMARY

Disclosed are methods, systems, and computer program products for implementing a multiple-patterning constraint-driven environment and user interface for interactive coloring of physical design components in a physical electronic design with multiple-patterning lithography technique awareness. Various embodiments provide a user interface to interactively determine the coloring of a physical design component in a layout based at least in part upon the user's manipulation of a physical design component in the layout and to provide feedback to the user or designer in nearly real-time in response to the user's manipulation of the physical design component. One of the advantages of this approach is that various physical design components will be appropriately assigned to their respective mask designs upon the creation of these physical components in the layout, and that the layout will be design rule clean upon its creation. Moreover, various embodiments interactively determine the coloring of a physical design component when the physical design component is being created in the layout. In other words, the methods or the systems may achieve their intended purposes even with a partial, incomplete layout.

In various embodiments, the method provides a design rule-driven environment and a user interface to identify, create, or modify a shape in a layout which may be a complete or an incomplete layout of the electronic design. The method then identifies a set of design rules or constraints that are relevant to the identified or created shape from, for example, the complete rule deck. The method may then determine the color of the shape based at least in part on one or more existing neighboring shapes and the input for modifying the identified shape. In other words, various embodiments provide a constraint-driven design interface that takes various design rules or constraints into account and colors various physical design components in accordance with the design process that creates or modifies these various physical design components.

For example, the method may identify the horizontal spacing constraint in the horizontal direction, the vertical spacing constraint in the vertical direction, one or more corner-to-corner spacing constraints, net-based constraints (e.g., net-to-net spacing constraints), or one or more voltage-based design rules or constraints for a rectangular shape that the method first identifies or creates. The method may then receive input for modifying the identified shape in the layout. For example, a designer may move this rectangular shape around in an area of the electronic design that is also populated with one or more existing shapes. In some embodiments, the term "modifying" broadly encompasses creating the first shape at an intended location, placing, translating, rotating, or mirroring the first shape, changing the location of the first shape in the layout, or changing the size or shape of the first shape in the layout.

The method may determine the relative location of the identified shape in relation to one or more existing shapes in the layout and then examine the relations between the identified, rectangular shape and the one or more existing shapes in view of the set of design rules or constraints and determine the color of the shape. For example, the designer may temporarily attempt to place the identified, rectangular shape at a temporary candidate location in an attempt to place the identified, rectangular shape. Before the method or system actually places the identified, rectangular shape at that temporary candidate location and commits the changes, the method may then take the relevant design rules or constraints and examine which mask design this identified, rectangular shape is to be assigned while taking the relevant design rules or constraints and the shape's current, temporary candidate location in the layout into account.

The method or the system may further provide graphical indications, textual indications, or a combination thereof in the user interface to the designer as feedback in response to the temporary candidate location. Therefore, the designer may know whether placing the rectangular shape at the temporary candidate location results in a legal placement, and which mask design this rectangular shape belongs to in nearly real-time. More importantly, various embodiments enable the designer to know whether the placement of the shape at the temporary candidate location results in any violations of various design rules or constraints before such violations actually occur.

In some embodiments where the electronic design includes multiple instances of a master cell, the method or the system determines the coloring scheme of each of the multiple instances independently. In these embodiments, the method or the system colors or recolors the physical design on an instance by instance basis without coloring or recoloring all instances instantiated from the same master.

In some embodiments where the identified shape may correspond to a fixed color that cannot be altered, the method may then performs substantially similar processes to determine the relative location of the identified shape with the fixed color in relation to one or more existing shapes in the layout and to examine the relations between the identified shape and the one or more existing shapes in view of the set of design rules or constraints to determine whether the identified shape at its current location in the layout complies with the set of design rules or constraints. In these embodiments, the method or the system also provides an interactive response to the current location of the identified shape in a nearly real-time manner to inform the designer of any possible violation of design rules or constraints and of any other changes in mask assignment of other shapes if the identified shape is to be placed at this temporary candidate location.

In other words, rather than determining the color of the identified shape, the method may determine whether the colors of the one or more existing shapes need to be altered, and if so, how these one or more existing shapes will be recolored by which color(s). In some embodiments, the method may further use a strongly connected graph to flip the colors of the one or more existing shapes if the method determines that the colors of one or more existing shapes need to be altered due to the placement of the identified shape with a fixed color at this temporary candidate location.

The method or the system may then provide feedback in the user interface to inform the user of the possible scope of change arising out of the placement of the identified shape with a fixed color at the temporary candidate location. The method or the system may also interactively provide the feedback to the designer to inform the designer of any violations of design rules or constraints in certain embodiments. In some of these certain embodiments, the method may further provide hints or recommendations to the designer as to how to avoid or resolve such violations of design rules or constraints. Moreover, the method or the system may further allow the designer to decide whether the placement of the identified shape at the temporary candidate location is acceptable and commit or scratch the changes accordingly.

In some embodiments, the method may further illustrate the set of constraints or design rules by showing, for example, one or more graphical indicator, one or more textual indicators, or a combination thereof in the user interface. For example, the method may draw one or more halos around the identified shape that undergoes the modification process or around some of the one or more existing static shapes. In some embodiments, the method or the system uses the halos to indicate that any encroachment upon the area enclosed by each of the one or more halos by one or more other shapes signifies a violation of the corresponding design rule(s) or constraint(s) while the identified shape is being created or modified.

The method may also provide graphical or textual representation of the violations or the set of design rules or constraints by indicating in the user interface the values required by the set of design rules or constraints. In various embodiments, the physical design is "multiple-patterning" ready and is DRC clean in that the physical design is appropriately split into multiple mask design based on the multiple-patterning constraints upon the creation of the physical design, and that the physical design complies with various sets of design rules upon the completion of the physical design. In some embodiments, the physical design thus created renders the conventional mask splitting process trivial because the shapes in the physical design have been appropriately colored upon the creation of these shapes in the physical design.

In some embodiments, the method or system may determine whether or not there exists a "loop" that prohibits coloring of a shape due to color conflicts or violations of a design rule in the existing design. In some of these embodiments, the method or the system may utilize one or more loop markers, which interactively show the existence of the "loop", or one or more spacer markers, which interactively show violation(s) of some design rule(s) of constraint(s), such as a spacing constraint in a user interface in a nearly real-time manner. The method or the system may further comprise an annotation browser which provides a collapsible and expandable textual description with one or more levels for each of the markers in the graphical interface.

Each textual description corresponds to a marker in the graphical interface, and the activation of one of the textual description and the marker triggers the activation of the other. For example, a user may activate a particular spacer marker in the annotation browser, and the system automatically displays the spacer marker at an appropriate zoom level in the graphical interface. The method or the system may further associate additional textual information or data with each marker in the graphical interface. The method or the system provides the functions to allow a user to manually repair any marker. The method or the system may also automatically repair a marker or provides hints or recommendations in a form of options or choices to the user to determine how to repair a particular marker.

In some embodiments, the method includes the process of identifying a schematic design view of the electronic design, the process of identifying an object for a modification process from a layout of the electronic design, the process of identifying a constraint from one or more sets of constraints, wherein the one or more sets of constraints are associated with positioning of the object in the layout, and the process of determining a mask identification of the object based at least in part upon the constraint.

In some of the above embodiments, the method may further include the process of performing the modification on the object in the layout. Some of these embodiments determines the mask identification during the performance and before the completion of the modification process. In some of the above embodiments, the method may further include the process of interactively displaying the mask identification or a result of whether the constraint is satisfied during the performance of the modification process. In some of the above embodiments, the method may further include the process of identifying a neighboring object to which the constraint applies for the object, in which the mask identification is determined based further at least in part upon an interrelation between the object and the neighboring object.

In some of the above embodiments, the method may further include the process of identifying a cluster which comprises the neighboring object and the process of identifying a data structure that includes information or data about one or more mask identifications for one or more objects in the cluster. In some of the above embodiments, the method may further include the process of determining whether the object is associated with a fixed mask identification and the process of determining whether the one or more mask identifications of the one or more objects in the cluster is to be changed based at least in part upon the constraint. In some embodiments, the method includes at least one of the process of determining or identifying one or more first indicators around the neighboring object or the one or more objects of the first cluster and the process of determining or identifying one or more second indicators around the object.

In some embodiments, the method further includes the process of changing at least one mask identification of the one or more mask identifications of the one or more objects in the cluster by using at least the data structure, wherein the act of changing the at least one mask identification is performed without considering the one or more sets of constraints in some of these embodiments. A constraint may comprise a multi-valued constraint that associates multiple constraint values for different values of a characteristic associated with the object, a net-based constraint, or a connectivity information-based constraint in some embodiments. In some embodiments, a constraint comprises multiple requirements for multiple characteristics of the object. An object may comprise a geometric shape, an interconnect, or a set of multiple geometric shapes in the layout in some embodiments. In some embodiments, the method may further comprise the process of identifying another cluster including multiple objects in the layout and the process of maintaining multiple mask identifications for the multiple objects in the another cluster without considering the mask identification of the object.

Some embodiments are directed at a hardware system that may be invoked to perform any of the methods, processes, or sub-processes disclosed herein. The hardware system may include at least one processor or at least one processor core, which executes one or more threads of execution to perform any of the methods, processes, or sub-processes disclosed herein in some embodiments. The hardware system may further include one or more forms of non-transitory machine-readable storage media or devices to temporarily or persistently store various types of data or information. Some exemplary modules or components of the hardware system may be found in the System Architecture Over section below.

Some embodiments are directed at an article of manufacture that includes a non-transitory machine-accessible storage medium having stored thereupon a sequence of instructions which, when executed by at least one processor or at least one processor core, causes the at least one processor or the at least one processor core to perform any of the methods, processes, or sub-processes disclosed herein. Some exemplary forms of the non-transitory machine-readable storage media may also be found in the System Architecture Over section below.

BRIEF DESCRIPTION OF THE DRAWINGS

The drawings illustrate the design and utility of various embodiments of the present invention. It should be noted that the figures are not drawn to scale and that elements of similar structures or functions are represented by like reference numerals throughout the figures. In order to better appreciate how to obtain the above-recited and other advantages and objects of various embodiments of the invention, a more detailed description of the present inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which:

FIGS. 5A-H illustrates some examples of some exemplary implementation of the method or system for implementing interactive coloring of physical design components in a physical electronic design with multiple-patterning techniques awareness in some embodiments.

FIGS. 6A-D illustrates some examples of a method or system for implementing interactive coloring of physical design components in a physical electronic design with multiple-patterning techniques awareness in some embodiments.

FIG. 7 illustrates a computerized system on which a method for implementing electronic designs with connectivity and constraint awareness may be implemented.

DETAILED DESCRIPTION

Various embodiments of the invention are directed to a methods, systems, and articles of manufacture for implementing electronic circuit designs with electro-migration awareness in a single embodiment or in some embodiments. Other objects, features, and advantages of the invention are described in the detailed description, figures, and claims.

Various embodiments will now be described in detail with reference to the drawings, which are provided as illustrative examples of the invention so as to enable those skilled in the art to practice the invention. Notably, the figures and the examples below are not meant to limit the scope of the present invention. Where certain elements of the present invention may be partially or fully implemented using known components (or methods or processes), only those portions of such known components (or methods or processes) that are necessary for an understanding of the present invention will be described, and the detailed descriptions of other portions of such known components (or methods or processes) will be omitted so as not to obscure the invention. Further, various embodiments encompass present and future known equivalents to the components referred to herein by way of illustration.

Disclosed are methods, systems, and computer program products for implementing a multiple-patterning design rule-driven environment and user interface for interactive coloring of physical design components in a physical electronic design with multiple-patterning lithography technique awareness. Various embodiments provide a user interface to interactively determine the coloring of a physical design component in a layout based at least in part upon the user's manipulation of a physical design component in the layout and to provide feedback to the user or designer interactively or in nearly real-time in response to the user's manipulation of the physical design component. Moreover, various embodiments interactively determine the coloring of a physical design component when the physical design component is being created in the layout. In these embodiments, the methods or the systems may achieve their intended purposes even with a partial, incomplete layout. More details about the methods or system for implementing interactive coloring of physical design components in a physical electronic design with multiple-patterning techniques awareness are provided below with reference to various drawing figures.

Figure 1:
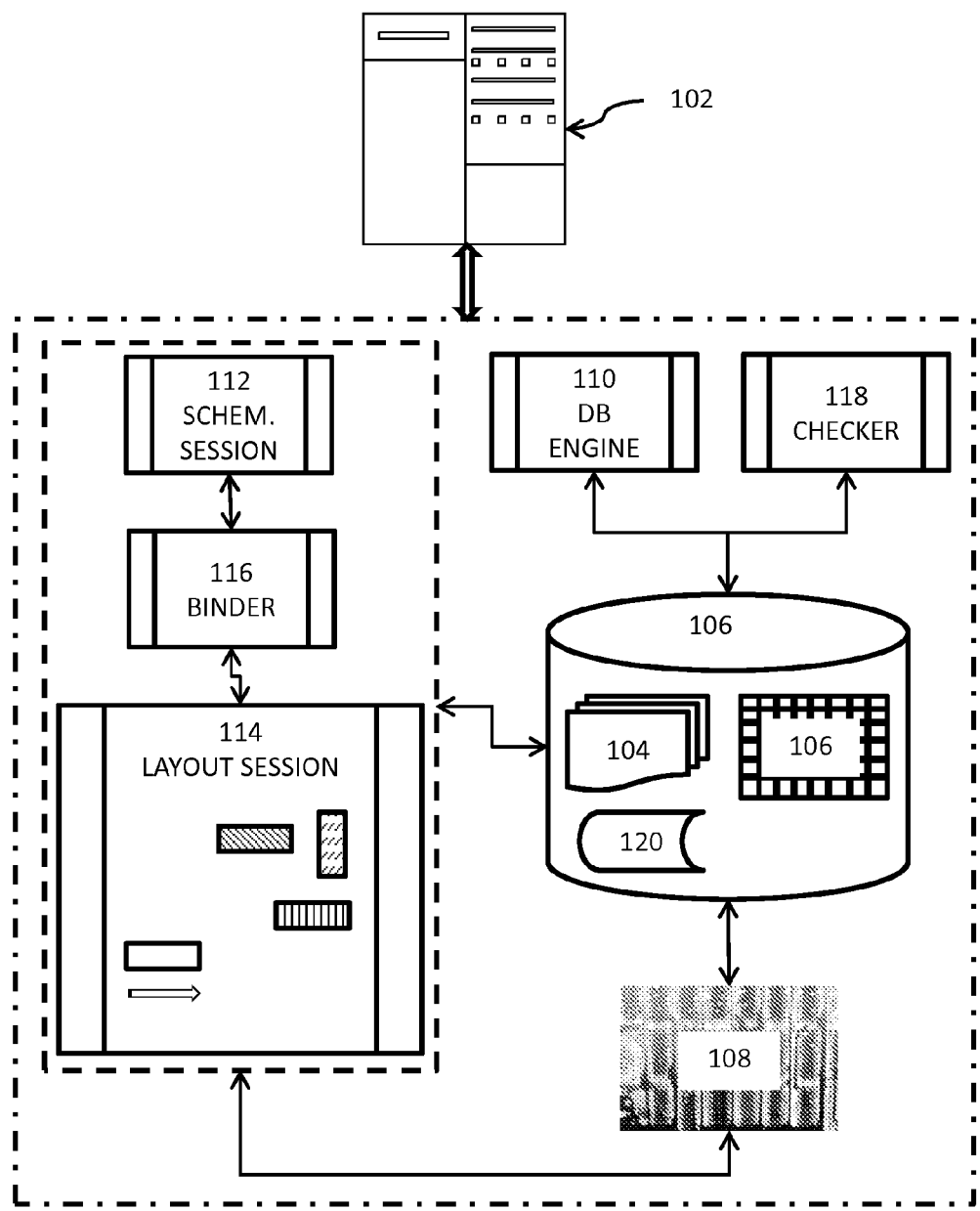
FIG. 1 illustrates a high level block diagram for a method or system for implementing interactive coloring of physical design components in a physical electronic design with multiple-patterning techniques awareness in some embodiments.

FIG. 1 illustrates a high level block diagram for implementing interactive, real-time checking or verification of constraints in some embodiments. In one or more embodiments, a designer may use one or more computing systems 102 to perform various processes or to invoke various hardware modules to create or manipulate an electronic design. The one or more computing systems 102 may comprise various electronic design tools such as, but not limited to, a schematic editor, a schematic simulator, a physical design tool, a physical design analysis engine, etc. The one or more computing system 102 may further initiate or interact with a schematic view 112 and a layout view 114 of an electronic design in some embodiments. In some embodiments, the layout view of an electronic design includes a partial, incomplete physical design that contains only a smaller portion of the physical design.

For example, the partial, incomplete physical design may contain only a single object that represent a single electronic design component, a net, or a portion thereof. The layout view 114 and the schematic view 112 may be bound together to allow communication of data or information between the two views of the electronic design with a binder mapping process or module 116. The one or more computing system 102 may also initiate or interact with a database engine 110 to, for example, perform or undo one or more transaction or maintaining one or more log records (e.g., undo logs, redo logs, state logs, etc.) in some embodiments. The one or more computing system 102 may also initiate or interact with a checker 118, such as a physical verification process or module or a design rule checking process or module in some embodiments.

The one or more computing system 102 may also initiate or interact with a connectivity engine 122 which performs the functions of, for example, receiving, updating, removing, or adding connectivity information, or maintaining other data or information about the connectivity information. Various embodiments use the connectivity information to keep track of which net a design component belongs to in an electronic circuit design. More details about the connectivity information and the connectivity engine is described in U.S. patent application Ser. No. 13/445,874, filed concurrently with the title "METHODS, SYSTEMS, AND ARTICLES OF MANUFACTURE FOR IMPLEMENTING ELECTRONIC DESIGNS WITH CONNECTIVITY AND CONSTRAINT AWARENESS". The content of this application is hereby expressly incorporated by reference in its entirety. The one or more computing system 102, the processes or modules 110, 118, and 122, and the session for the schematic view design 112, the session for the layout view design 114, or the binder mapping process or module 116 may also initiate or interact with a non-volatile, non-transitory computer accessible medium 106 and a volatile, non-transitory computer accessible medium 108 to read data or information from or write data or information to these non-transitory computer accessible media.

In some embodiments, the non-volatile, non-transitory computer accessible medium 106 may store thereupon data or information that comprises, for example but not limited to, one or more rule decks 104 for various design rules, constraints, requirements, or goals (collectively constraint or constraints), one or more data structures 106 (e.g., database tables, lists, tables, trees, graphs, etc.), connectivity information, standard or custom libraries, or any other data 120 that are needed or desired for the performance of various processes disclosed herein. In some embodiments, the non-transitory volatile computer accessible medium 108 may store thereupon data or information that comprises, for example but not limited to, temporary data, uncommitted transaction data, temporary values of one or more variables or states of various processes or modules, etc. The one or more computing system 102 may also invoke a user interface to interact with a display apparatus (not shown) to provide interactive or nearly real-time feedback to a user.

Figure 2:
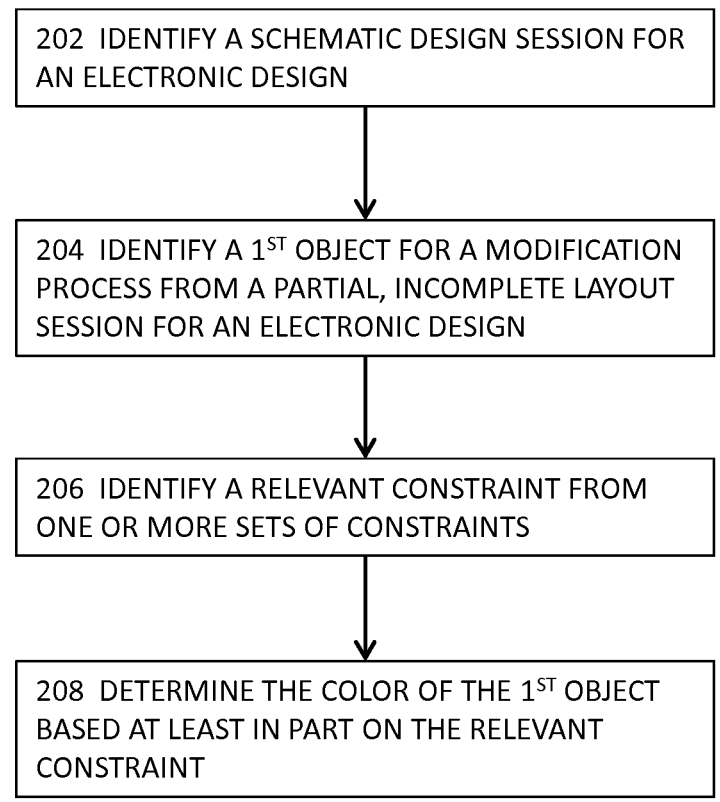
FIG. 2 illustrates high level block diagram for a method or system for implementing interactive coloring of physical design components in a physical electronic design with multiple-patterning techniques awareness in some embodiments.

FIG. 2 illustrates high level block diagram for a method or system for implementing interactive coloring of physical design components in a physical electronic design with multiple-patterning techniques awareness in some embodiments. In some embodiments, the method or system for implementing interactive coloring of physical design components in a physical electronic design with multiple-patterning techniques awareness may comprise the respective process or module 202 for identifying a schematic design session including a schematic design view of an electronic design. In some embodiments, the method or system may comprise the respective process or module 204 of identifying a first object for a modification process from a layout of the electronic design.

In some embodiments, the layout comprises only a partial, incomplete physical design of the electronic design. For example, the partial, incomplete physical design may contain only a single object that represents a single electronic design component, a net, or a portion thereof, an interconnect, a segment of an interconnect, an instance of a cell, a portion of an instance of a cell, etc. in some embodiments. An object such as the first object may comprise a geometric shape in the electronic design, a net or a portion thereof, a cell instance, or a portion of the layout of the electronic design in some embodiments.

In some embodiments, the method or system may comprise the respective process or module 206 of identifying one or more relevant constraints, design rules, requirements, or goals (collectively constraint or constraints) from one or more sets of constraints, where each set of the one or more sets includes one or more constraints. More details about identifying one or more relevant constraints are provided in U.S. patent application Ser. No. 13/445,860, filed concurrently with the title "METHODS, SYSTEMS, AND ARTICLES OF MANUFACTURE FOR IMPLEMENTING INTERACTIVE, REAL-TIME CHECKING OR VERIFICATION OF COMPLEX CONSTRAINTS", the content of which is hereby expressly incorporated by reference in its entirety for all purposes.

In some embodiments, the method or system may comprise the respective process or module 208 of determining the color of the first object based at least in part upon the one or more relevant constraints. In various embodiments, the color of an object generally refers to the mask identification of the object which is used to indicate with which mask design of a plurality of mask designs the object is associated and is to be printed. Throughout this description, the terms "color" and "mask identification" are therefore used interchangeably, unless otherwise specifically recited or claimed. More details about the process or module 208 are provided below.

Figure 3:
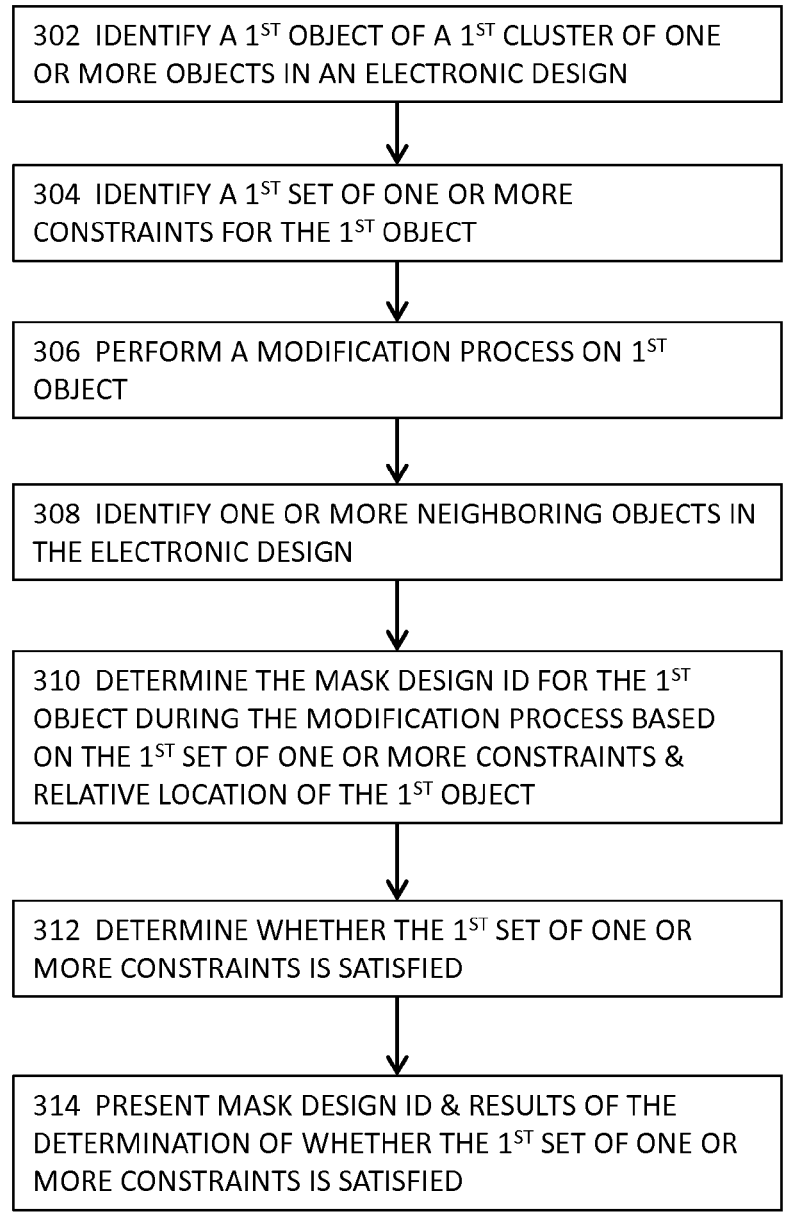
FIG. 3 illustrates a more detailed block diagram for a method or system for implementing interactive coloring of physical design components in a physical electronic design with multiple-patterning techniques awareness in some embodiments.

FIG. 3 illustrates a more detailed block diagram for a method or system for implementing interactive coloring of physical design components in a physical electronic design with multiple-patterning techniques awareness in some embodiments. In some embodiments, the method or system may comprise the respective process or module 302 of identifying a first object of a first cluster of one or more objects in an electronic circuit. In some embodiments, a cluster includes a set of one or more objects in a physical electronic design. In some embodiments, the first object represents a dynamic object that is subject to a modification process.

A modification process may include, for example but not limited to, creating or adding, removing, translating, rotating, mirroring, resizing the geometric shape in the physical design or placement, routing, or post-route optimization. On the other hand, a static object represents an object whose position (e.g., location, orientation, etc.) remains unchanged in an electronic design, at least during the performance of a modification process on a dynamic object. In some embodiments, the method or system may comprise the respective process or module 304 of identifying one or more sets of constraints that are related to, associated with, or may be applied to the first object.

In some embodiments, the method or system may comprise the respective process or module 306 of performing the modification process on the first object to generate one or more changes in the first object or in the remaining portion of the layout. The one or more changes include, for example but not limited to, a change in location, orientation, shape, or size of the first object or other portion of the layout, an addition of the first object to the layout, a removal of the first object or one or more other objects in the layout, etc. In some embodiments, the method or system may comprise the respective process or module 308 of identifying one or more neighboring objects in the layout. In some embodiments, the method or system identifies the object(s) in the current layout view window as the one or more neighboring objects.

In some embodiments, the method or system identifies the object(s) within a range or radius of influence with respect to a reference node (e.g., the first object or any other suitable reference points in the layout) as the one or more neighboring objects. In some embodiments, the method or system may comprise the respective process or module 310 of determining the mask design identification for the first object. In some of these embodiments, the method or the system identifies the mask design identification for the first object during the performance of the modification process on the first object and thus may provide interactive or nearly real-time feedback to the user with the information indicating which mask design the first object may be printed with at any given point in time during the performance of the modification process.

In some embodiments, the method or system may comprise the respective process or module 312 of determining whether the one or more relevant constraints are satisfied with the first object. In some embodiments, the method or system determines whether the one or more relevant constraints are satisfied during the performance and before the completion of the modification process to provide interactive feedback for the compliance or violation of the one or more relevant constraints while the modification process is being performed on the first object. More details about the determination of whether a certain constraint is satisfied are provided in the U.S. patent application Ser. No. 13/445,860, filed concurrently with the title "METHODS, SYSTEMS, AND ARTICLES OF MANUFACTURE FOR IMPLEMENTING INTERACTIVE, REAL-TIME CHECKING OR VERIFICATION OF COMPLEX CONSTRAINTS", the content of which is hereby expressly incorporated by reference in its entirety for all purposes.

In some embodiments, the method or system may comprise the respective process or module 314 of presenting the mask design identification or the results of the process or module 312 of determining whether the one or more relevant constraints are satisfied. In some embodiments, the method or system presents the results or the mask design identification to a user via, for example, a user interface.

Figure 4:
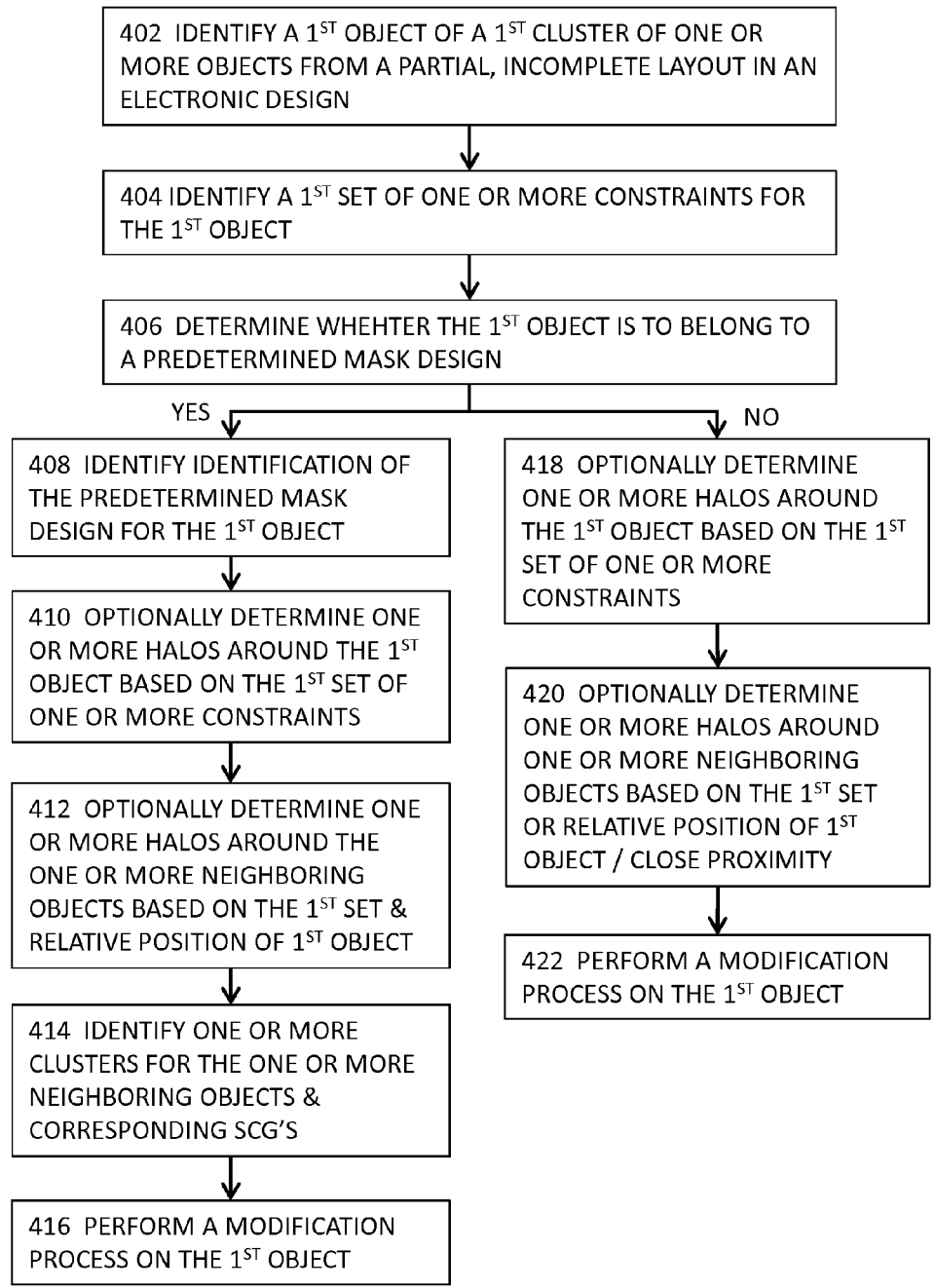
FIG. 4 illustrates a more detailed block diagram for a method or system for implementing interactive coloring of physical design components in a physical electronic design with multiple-patterning techniques awareness in some embodiments.
Figure 4:
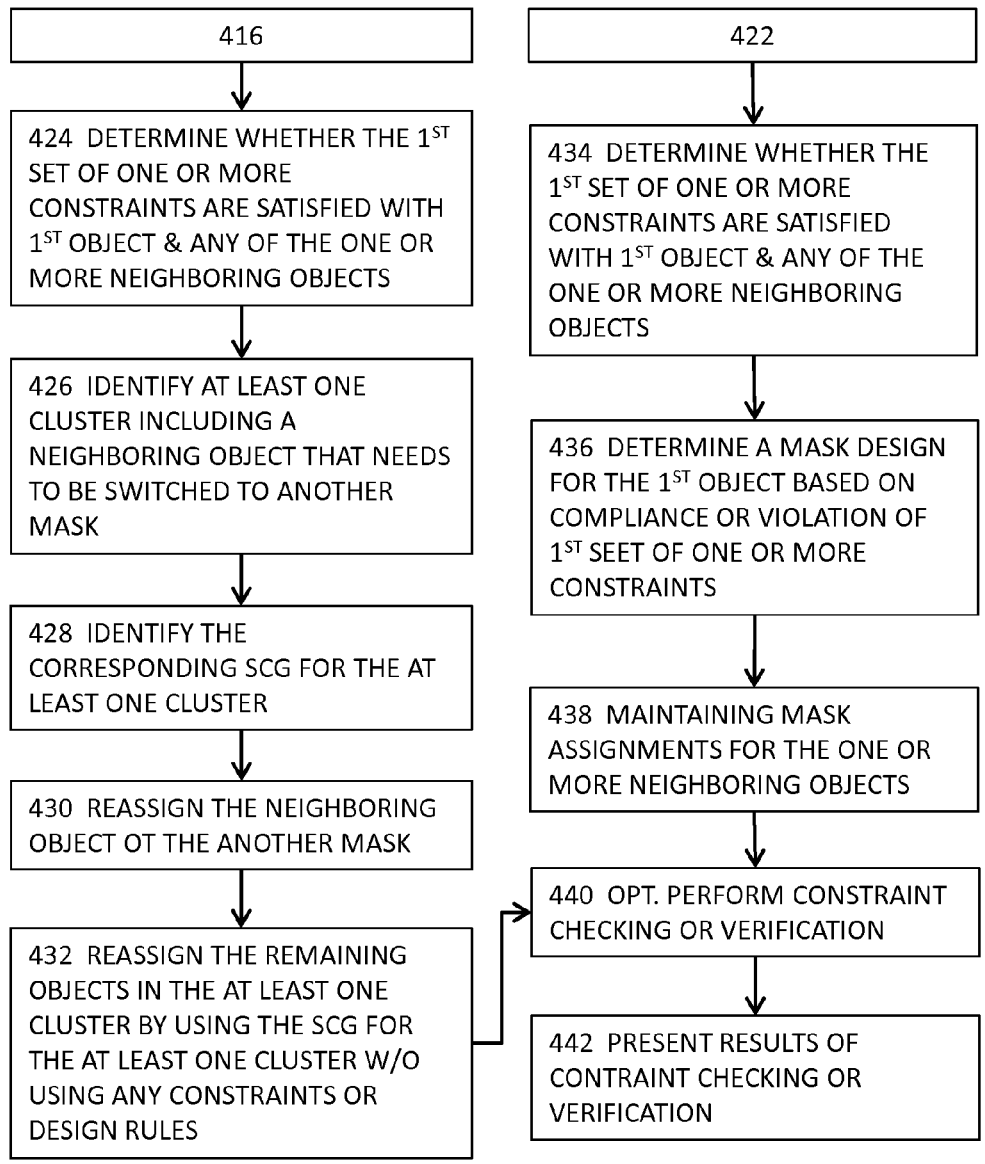

FIG. 4 illustrates a more detailed block diagram for a method or system for implementing interactive coloring of physical design components in a physical electronic design with multiple-patterning techniques awareness in some embodiments. In some embodiments, the method or system implementing interactive coloring of physical design components in a physical electronic design with multiple-patterning techniques awareness may comprise the respective process or module 402 of identifying a first object of a first cluster of one or more objects from a layout. In some embodiments, the layout comprises only a partial, incomplete physical design of an electronic circuit.

In some embodiments, the first object represents a dynamic object on which a modification process is to be performed. In some embodiments, the method or system may comprise the respective process or module 404 of identifying one or more relevant constraints for the first object. In various embodiments, an object in the layout may be subject to one or more sets of constraints, where each set includes one or more constraints, and the system maintains a rule deck of a plurality of constraints.

In some embodiments, the method or the system may pick and choose or may allow a user to select one or only a smaller subset of these plurality of constraints or the one or more sets of constraints based at least in part on, for example, various criteria or factors of some corner analyses or some single- or multiple-scenario what-if analyses. In some embodiments, the method or system may comprise the respective process or module 406 of determining whether the first object is to be associated with a predetermined mask design. In some embodiments, it may be required or desired for an object to be printed with a certain mask. In these embodiments, the mask identification for the object is thus fixed and cannot be altered, absent some extraordinary justification or reasons that require otherwise.

In some embodiments where the first object is to be associated with a certain mask design, the method or system may comprise the respective process or module 408 of identifying the mask identification of the mask design with which the first object is associated. For example, if the first object is to be printed with mask 1, the method or the system may thus associate the first object with the identification of mask 1. In some embodiments, the mask identification may comprise the form of a bitmap value, a unique color displayed in a graphical user interface, a textual indication in a graphical or textual user interface, a textual, graphical, or symbolic link in a link data structure, a pointer, or any other suitable indications to uniquely identify the mask design with which the first object is associated.

In some of these embodiments, the method or system may further optionally comprise the respective process or module 410 of determining one or more halos around the first object based on the one or more relevant constraints to indicate an area governed by the one or more relevant constraints within which the mask identification of the first object or one or more other objects need to be altered due to a violation of at least one of the one or more relevant constraints. In some of these embodiments, the method or system may further optionally comprise the respective process or module 412 of determining one or more halos around at least one of the one or more neighboring objects based at least in part upon the one or more relevant constraints.

In some embodiments, the process or module 412 may determine one or more halos around the at least one of the one or more neighboring objects based further at least in part on the relative position of the first object to some of the one or more neighboring objects at some point in time or on the close proximity between the first object and the at least some of the one or more neighboring objects. In some embodiments, the one or more halos determined at 410 or 412 may be shown in, for example, a user interface, regardless of how close the first object is to any of the one or more neighboring objects. In some of these embodiments, the method or system may further comprise the respective process or module 414 of identifying one or more clusters for the one or more neighboring objects and the corresponding strictly connected graph for each of the one or more clusters.

In some embodiments, the method or system may determine a strictly connected graph for a cluster to indicate the mask identification for each of one or more objects in a cluster. In some embodiments, a strictly connected graph comprises a directed graph (or an oriented graph) that includes a set of vertices, a set of edges, and a set of associations that associate each edge with a not necessarily distinct ordered pair of vertices in the set of vertices, where for every two distinct vertices in the set of vertices, there exists a path from one of the two distinct vertices to the other vertex. In some embodiments, the method or the system may use other types of graphs or data structures to store the mask identifications for objects in a cluster.

In these embodiments, the method or system uses the strictly connected graph to track the mask identifications of the object(s) in the cluster. One of the advantages of this approach is that if the method or system needs to change the mask identification of a first object of one or more objects in the cluster, the method or system may refer to the remaining mask identifications in the strictly connected graph and changes the remaining mask identifications according to the change in the mask identification of the first object and the original mask identifications for the remainder of the one or more objects in the cluster without re-determining which mask a certain object is to be re-associated with.

For example, if a cluster includes objects A, B, and C in a binary mask system, and if objects A and B are originally associated with mask 1 and object C is originally associated with mask 2 as indicated in the strictly connected graph for the cluster. With a modification process, the method or system determines that the mask identification of object B needs to be changed to mask 2. With this approach, the method or the system may automatically flip the mask identification for object A and object C, without re-determining which mask object A is to be associated with or which mask object C is to be associated with. It shall be noted that the above example illustrates the operations of the method or system in some embodiments where a double-patterning technique applies.

Nonetheless, the approach described herein applies equally to multiple-patterning techniques other than double-patterning techniques.

In some of these embodiments, the method or system may further comprise the respective process or module 416 of performing a modification process on the first object to generate one or more changes in the first object or in other part of the layout. In some of these embodiments, the method or system may comprise the respective process or module 418 of determining whether the one or more relevant constraints are satisfied with the first object and the one or more neighboring objects in the layout. In these embodiments, the compliance with or violation of the one or more relevant constraints may affect the assignment of the first object to a particular mask design.

For example, if the modification process causes the first object to move within certain proximity of a neighboring object so as to violate a same mask constraint requiring some minimum spacing between the first object and a neighboring object at some point in time during the modification process (e.g., placing the first object) such that both the first object and the neighboring object may be printed with the same mask, the method or the system may assign the first object to a different mask design that is different from that of the neighboring object due to the violation of the same mask constraint.

In some embodiments, the method or system determines at 424 whether the one or more relevant constraints are satisfied during the performance of the modification process on the first object to provide interactive or nearly real-time feedback to the designer to indicate whether, for example, the current state of the first object (e.g., position or size of the first object at a particular point in time) is legal or whether the first object is to be associated with a specific mask design. In some of these embodiments, the method or system may optionally comprise the respective process or module 426 of identifying at least one cluster including a neighboring object that needs to be reassigned to a different mask design from the originally associated mask design.

In these embodiments where the first object is associated with a fixed mask design, the method or system may reassign the mask identification of a neighboring object if the relationship between first object and the neighboring object violates one or more constraints that impose limitations on mask assignment. In these embodiments, the method or system identifies a cluster to which the neighboring object belongs. In some of these embodiments, the method or system may comprise the respective process or module 428 of identifying the corresponding strictly connected graph or a data structure that provides the mask identification information or data for each object in the at least one cluster.

In some of these embodiments, the method or system may comprise the respective process or module 430 of reassigning the neighboring object in the one or more neighboring objects to another mask design based at least in part upon the fixed mask identification of the first object and at least one of the one or more relevant constraints that is violated due to the performance of the modification process on the first object at some point in time. In these embodiments, the method or system utilizes the information or data in the strictly connected graph or the data structure to reassign the neighboring object in the cluster to a different mask design due to the fixed mask identification of the first object and the performance of the modification process on the first object.

In some of these embodiments, the method or system may comprise the respective process or module 432 of reassigning one or more remaining neighboring objects in the at least one cluster by using one or more strictly connected graphs or one or more data structures providing information or data for determining mask identifications for the remainder of the one or more neighboring objects in the at least one cluster. In these embodiments, the method or system without having to re-determining the mask identifications of any of the objects in the cluster or with which mask designs any of the remainder of the one or more neighboring objects in the at least one cluster are associated. In some of these embodiments, the method or system may optionally comprise the respective process or module 440 of performing checking or verification of the one or more relevant constraints or one or more other constraints to determine whether there exist any constraint violations in the layout. In some of these embodiments, the method or system may comprise the respective process or module 442 of presenting, displaying, or storing results of the constraint checking or verification.

In some embodiments where the method or system determines that no object is to be associated with a predetermined mask design at 406, the method or system may optionally comprise the respective process or module 418 of determining one or more halos around the first object based at least in part upon the one or more relevant constraints in a substantially similar manner as that described for 410. In some of these embodiments, the method or system may optionally comprise the respective process or module 420 of determining one or more halos around at least some of the one or more neighboring objects based at least in part upon the one or more relevant constraints.

In addition or in the alternative, the process or module 420 may further determine the one or more halos based at least in part upon the relative position between the first object and the at least some of the one or more neighboring objects or upon the close proximity of the first object to at least some of the one or more neighboring objects. In some embodiments, the process or module 420 determines and shows the one or more halos regardless of how close the first object is to the at least some of the one or more neighboring objects. In some of these embodiments, the method or system may optionally comprise the respective process or module 422 of performing a modification process on the first object.

In some of these embodiments, the method or system may comprise the respective process or module 434 of determining whether the one or more relevant constraints are satisfied with the first object and the one or more neighboring objects. In some embodiments, the method or system captures the state of at least a portion of the layout including the first object and the one or more neighboring objects at a point in time during the performance of the modification process on the first object. In these embodiments, the method or system provides interactive feedback for the mask assignment or "coloring" of an object in nearly real-time while the object is being created or manipulated (e.g., placed) in a layout.

In some of these embodiments, the method or system may comprise the respective process or module 436 of determining a mask design for the first object that is different from the original mask design that the first object is associated with. For example, if the first object is not yet associated with any mask design or if the first object's original mask identification with a mask design—Mask 1—may be altered, and if a modification process that moves the first object sufficiently close to a second object, which has been associated with Mask 1 as well, such that a same mask constraint, which requires a minimum spacing between two adjacent objects to be printed with the same mask, is violated, the method or system may associate the first object with, for example, the mask design Mask 2 or Mask 3 such that the same mask constraint is no longer violated.

In some of these embodiments, the method or system may comprise the respective process or module 438 of maintaining the assignments or associations between the one or more neighboring objects and their respective mask identifications. In some of these embodiments, the method or system may optionally comprise the respective process or module 440 of performing checking or verification of the one or more relevant constraints or one or more other constraints to determine whether there exist any constraint violations in the layout. In some of these embodiments, the method or system may comprise the respective process or module 442 of presenting, displaying, or storing results of the constraint checking or verification.

Figure 5E:
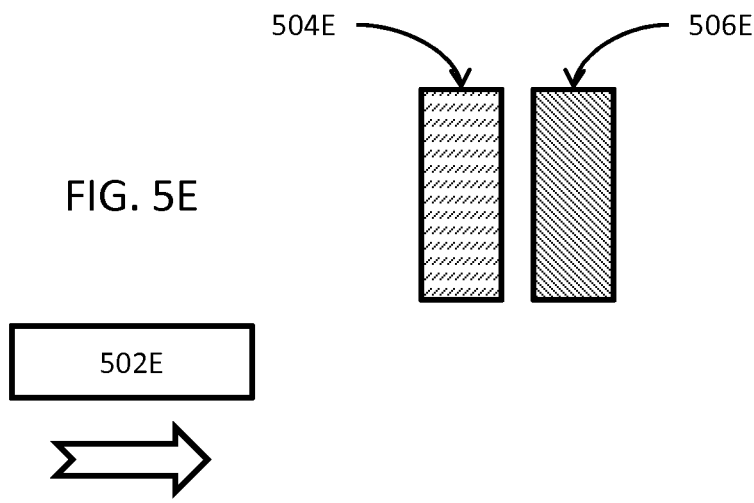

FIGS. 5A-H illustrates some examples of some exemplary implementation of the method or system for implementing interactive coloring of physical design components in a physical electronic design with multiple-patterning techniques awareness in some embodiments. More specifically, FIGS. 5A-C illustrates the capability of the method or system to handle a multi-valued constraint, such as a table-based spacing constraint between two objects, in some embodiments. FIG. 5A illustrates the positioning of object 506A and object 504A at, for example, a point in time during a modification (e.g., a placement process in this example). These two objects 504A and 506A are positioned in the layout at a certain spacing indicated by 508A. The multi-valued spacing constraint requires different spacing values for different parallel run-length (as encompassed by the rectangular area 502A) between two adjacent objects. In this example illustrated in FIG. 5A, the spacing 508A does not meet the minimum spacing requirement for positioning two adjacent objects on the same mask. As a result, the method or system assigns object 504A and object 506A to two different mask designs as indicated by their respective hatch patterns.

FIG. 5B illustrates the positioning of object 506B and object 504B at, for example, a point in time during a modification (e.g., a placement process in this example). These two objects 504B and 506B are positioned in the layout at a certain spacing indicated by 508B, where object 504B is rotated 90 degrees. The minimum spacing requirement for the same mask constraint is reduced due to the decrease in the parallel run-length between object 504B and object 506B. The multi-valued spacing constraint requires different spacing values for different parallel run-length between two adjacent objects as indicated by the rectangular area 502B, which represents a shorter parallel run-length than that as indicated by 502A. In this example illustrated in FIG. 5B, the spacing 508B does not meet the minimum spacing requirement for positioning two adjacent objects on the same mask although the minimum spacing requirement is reduced due to reduced parallel run-length between object 504B and object 506B. As a result, the method or system assigns object 504B and object 506B to two different mask designs as indicated by their respective hatch patterns.

FIG. 5C illustrates the positioning of object 506C and object 504C at, for example, a point in time during a modification (e.g., a placement process in this example). These two objects 504C and 506C are positioned in the layout at a certain spacing indicated by 508C, where both object 506C and object 504C are rotated 90 degrees as compared to FIG. 5A. The minimum spacing requirement for the same mask constraint is further reduced due to the further decrease in the parallel run-length (as indicated by the rectangular area 502C) between object 504C and object 506C as compared to FIG. 5B as illustrated in the rectangular are 502B. The multi-valued spacing constraint requires different spacing values for different parallel run-length between two adjacent objects. In this example illustrated in FIG. 5C, the spacing 508C does not meet the minimum spacing requirement for positioning two adjacent objects on the same mask although the minimum spacing requirement is further reduced due to further reduced parallel run-length between object 504C and object 506C. As a result, the method or system assigns object 504C and object 506C to two different mask designs as indicated by their respective hatch patterns.

FIG. 5D illustrates that two objects 510D and 506D are placed in the layout as illustrated, and that object 508D is associated with, for example, a first mask design, and object 506D is associated with a second mask design as indicated by their respective hatch patterns. FIG. 5D further illustrates that, at a particular instant of time, a modification process attempts to position object 504D as illustrated in FIG. 5D. In this example, the positioning of object 504D violates the corner-to-corner constraint or the same mask spacing constraint between object 504D and object 508D and that between object 504D and object 506D as indicated by the area 502D. As a result, the method or system shows that the positioning or placement of object 504D as illustrated in the current location of 504D is illegal before the method or system finally places object 504D at that location to cause constraint violations.

FIGS. 5E-H illustrate an example of a method or system for implementing interactive coloring of physical design components in a physical electronic design with multiple-patterning techniques awareness in some embodiments. FIG. 5E illustrates an example that starts with two static shapes 504E, which has been associated with the first mask design, and 506E, which has been associated with the second mask design. FIG. 5E further illustrates that a modification process attempts to move object 502E, which has not been associated with any mask designs, as indicated by its absence of any hatch pattern, horizontally toward object 504E and object 506E. It shall be noted that the modification process may position object 502E in any manner, such as rotating, mirroring, translating in any directions, resizing, altering the shape of object 502E, or a combination thereof, and that the horizontal translation merely constitutes an example for the ease of illustration and explanation.

Figure 5F:
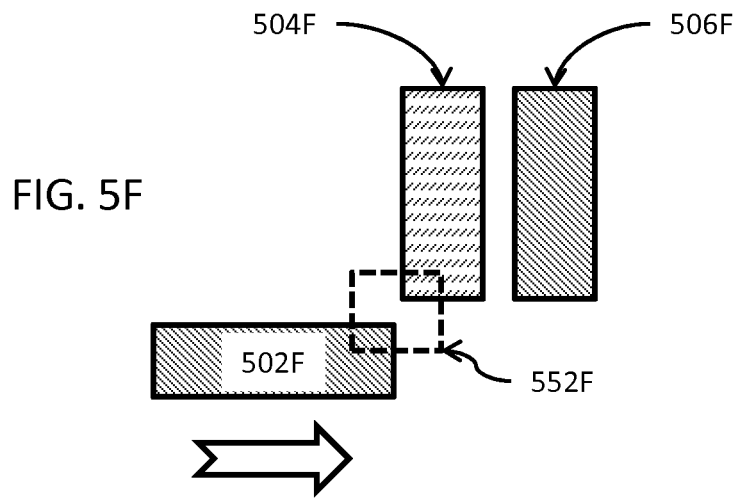

FIG. 5F continues from FIG. 5E and includes object 504F, which is associated with the first mask design, and object 506F, which is associated with the second mask design. FIG. 5F further illustrates a state of the layout during the performance of the modification process, where object 502F has been moved sufficiently close to object 504F at a particular instant of time to violate, for example, a corner-to-corner constraint as indicated by a graphical symbol (the dashed box 552F) in the user interface. The method or system may thus associated object 502F with the second mask with which object 506F is also associated. With this interactive feedback, a user may thus be made aware of the mask identification of the object 502F undergoing the modification process as well as the reasons for associating object 502F with its respective mask design, as indicated by the graphical symbol 552F.

Figure 5G:
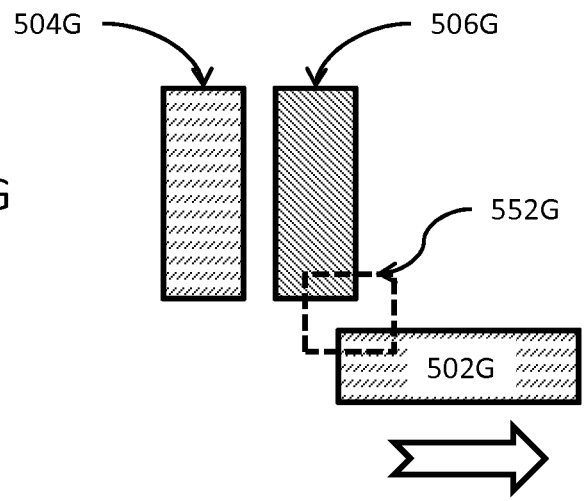

FIG. 5G continues from FIG. 5F and illustrates the scenario where the modification process further moves object 502F horizontally past object 504G, which is associated with the first mask design, to the right of object 506G, which is associated with the second mask design. FIG. 5G further illustrates that at this particular instant of time during the performance of the modification process, object 502G remains sufficiently close to object 506G so as to violate, for example, a corner-to-corner constraint between these two objects as indicated by the graphical symbol 552G. As a result, the method or system may associate object 502G with the first mask design, with which object 504G is also associated. With this interactive feedback, a user may thus be made aware of the mask identification of the object 502G undergoing the modification process as well as the reasons for associating object 502G with its respective mask design, as indicated by the graphical symbol 552G.

Figure 5H:
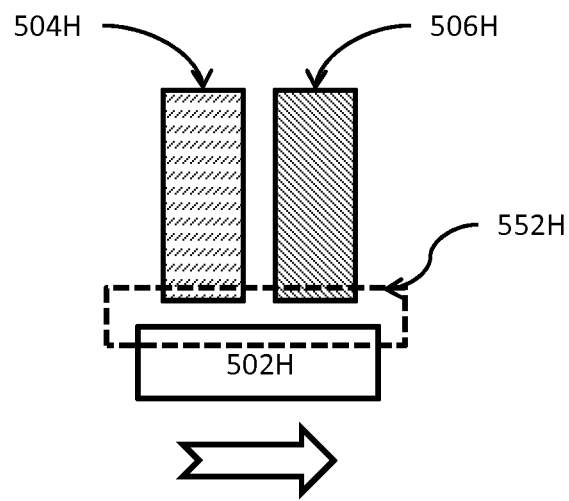

FIG. 5H continues from FIG. 5G and illustrates the scenario where the modification process further moves object 502H horizontally to a position that is below both object 504H, which is associated with the first mask design, and object 506H, which is associated with the second mask design, at least for a brief moment during the performance of the modification process on object 502H. FIG. 5H further illustrates that at this particular instant of time during the performance of the modification process, object 502H remains sufficiently close to object 506H and object 504H so as to violate, for example, a corner-to-corner constraint or a minimum spacing constraint between these two objects as indicated by the graphical symbol 552H. As a result, the method or system does not associate object 502 with the first mask design or the second mask design, as indicated with its absence of a matching pattern with object 504H and object 506H. With this interactive feedback, a user may thus be made aware that the instant location of the object 502H undergoing the modification process may be illegal. In addition, a user may thus be made aware of the reasons for not associating object 502G with the first or second mask designs, as indicated by the graphical symbol 552H.

FIGS. 6A-D illustrates some examples of a method or system for implementing interactive coloring of physical design components in a physical electronic design with multiple-patterning techniques awareness in some embodiments. FIG. 6A illustrates a cluster 602A of objects including objects 610A, 612A, and 614A, all of which are associated with the first mask design, and object 608A, which is associated with the second mask design, as indicated by their respective hatch patterns. FIG. 6A further illustrates a second cluster 604A including three objects, two of which are associated with the first mask design, and the other is associated with the second mask design. FIG. 6A further illustrates attempts to move object 606A horizontally toward the cluster 602A. Object 606A has not been associated with any mask designs (e.g., the first mask design or the second mask design) as indicated by its absence of a matching hatch pattern.

FIG. 6B continues from FIG. 6A and illustrates the first cluster 602B including objects 610B, 612B, and 614B associated with the first mask design and object 608B associated with the second mask design. FIG. 6B further illustrates a second cluster 604B including three objects, two of which are associated with the first mask design, and the other is associated with the second mask design. As it may be seen the mask identifications of the three objects in 602B are identical to those of 602A. In addition, FIG. 6B further illustrates that the modification process moves object 606B to the location as shown in FIG. 6B to cause a violation of a, for example, corner-to-corner constraint between object 606B and object 610B, as indicated by the graphical symbol 616B. In this example, the method or system may associate object 606B with the second mask design, with which object 608B is also associated to avoid the constraint violation. This may be accomplished because object 606B has not been associated with any mask designs.

FIG. 6C illustrates the first cluster 602C including objects 610C, 612C, and 614C associated with the first mask design and object 608C associated with the second mask design. FIG. 6C further illustrates a second cluster 604C including three objects, two of which are associated with the first mask design, and the other is associated with the second mask design. As it may be seen the mask identifications of the three objects in 602C are identical to those of 602A and 602B. In addition, FIG. 6C further illustrates that the modification process attempts to move object 606C in a horizontal direction toward the first cluster 602C. In this example, object 606C has been associated with a fixed mask design—the first mask design. For example, a designer may designate object 606C to be printed with the first mask.

FIG. 6D continues from FIG. 6C and illustrates the first cluster 602D including objects 610D, 612D, and 614D associated with the first mask design and object 608B associated with the second mask design. FIG. 6D further illustrates a second cluster 604D including three objects, two of which are associated with the first mask design, and the other is associated with the second mask design. As it may be seen the mask identifications of the three objects in 602D are identical to those of 602A, 602B, and 602C. In addition, FIG. 6D further illustrates that the modification process moves object 606D to the location as shown in FIG. 6D to cause a violation of a, for example, corner-to-corner constraint between object 606D and object 610D, as indicated by the graphical symbol 616D.

In this example, the method or system cannot re-associate object 606D because object 606D has been associated with a fixed mask identification. Rather, the method or system may now re-associate object 610D with the second mask design to avoid the constraint violation. In the meantime, the method or system may refer to the strictly connected graph or data structure for the first cluster 602D to flip the mask identifications of each of the remaining objects in the first cluster 602D without re-determining which mask each of the remaining objects is to be associated with. As it may be seen from FIG. 6D, object 608D is now re-associated with the first mask design as is object 606D, and objects 610D, 612D, and 614D may be re-associated with the second mask design. It shall be noted that the mask identifications of the three objects in the second cluster 604D remain unchanged because the changes in object 606D and in the first cluster do not propagate sufficiently far to affect the mask identifications of the objects in the second cluster 604D.

Figure 8:
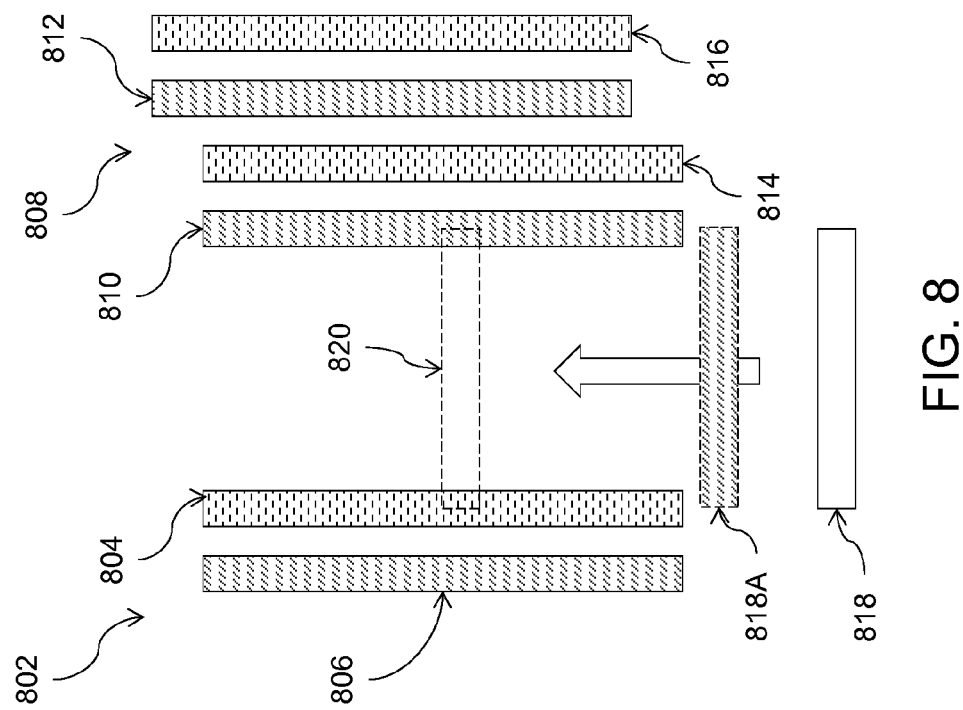
FIG. 8 illustrates an exemplary implementation of the method or system for implementing interactive coloring of physical design components in a physical electronic design with multiple-patterning techniques awareness in some embodiments.

FIG. 8 illustrates an exemplary implementation of the method or system for implementing interactive coloring of physical design components in a physical electronic design with multiple-patterning techniques awareness in some embodiments. More specifically, FIG. 8 illustrates a first cluster 802 including object 806, which is associated with the first mask, and object 804, which is associated with the second mask. FIG. 8 also illustrates a second cluster 808 including object 810 and object 812, both of which are associated with the first mask design, and object 814 and object 816, both of which are associated with the second mask.

In the example illustrated in FIG. 8, the method or system performs a modification process to position object 818, which is not yet assigned to any mask design as indicated by its absence of any matching mask identification hatch pattern, from a first position as indicated by the rectangular shape with a solid line boundary to a second position as indicated by the rectangular shape with a dashed line boundary 820. As the modification process moves object 818 sufficiently close to object t804 and 810, the method or system may associate object at the position indicated by 818A with the second mask design if the method or system determines that a same mask constraint is violated due to the close proximity of the dynamic object at position 818A to object 804 and object 810. It is further assumed that the first cluster is associated with a first strictly connected graph or data structure that stores data or information about the mask identifications of objects 806 and 804 or about the mask identification change between object 804 and object 806. It is also assumed that the second cluster is associated with a second strictly connected graph or data structure that stores data or information about the mask identifications of objects 810, 812, 814, and 816 or about the mask identification changes among the objects 810, 812, 814, and 816.

Figure 9:
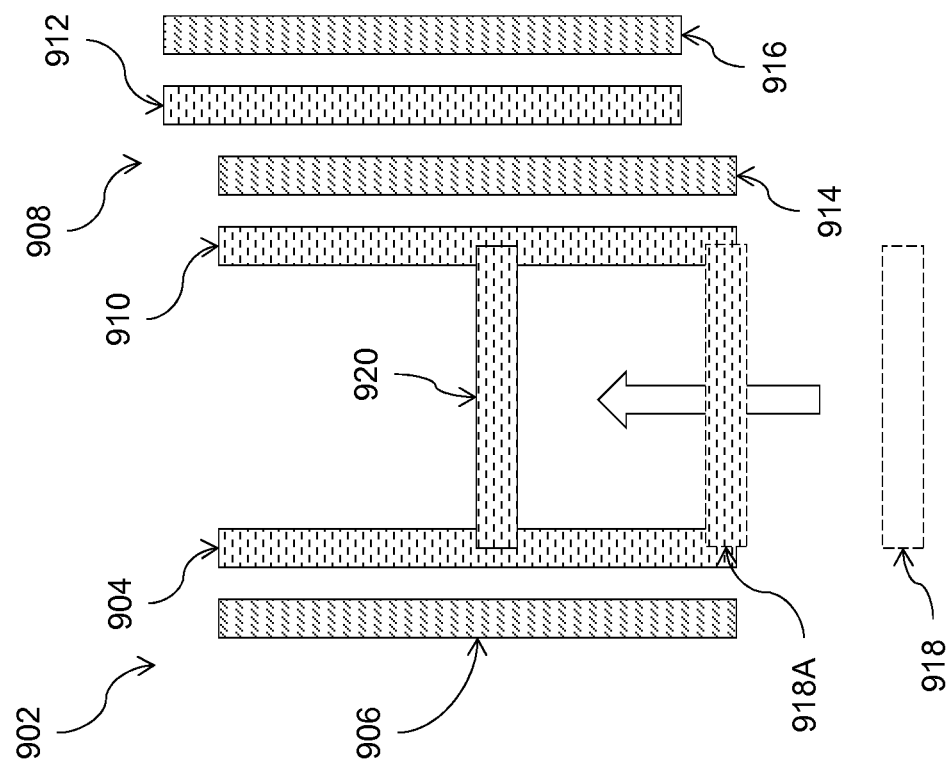
FIG. 9 illustrates an exemplary implementation of the method or system for implementing interactive coloring of physical design components in a physical electronic design with multiple-patterning techniques awareness in some embodiments.

FIG. 9 illustrates an exemplary implementation of the method or system for implementing interactive coloring of physical design components in a physical electronic design with multiple-patterning techniques awareness in some embodiments. More specifically, FIG. 9 illustrates a first cluster including object 906, which was originally associated with the first mask, and object 904, which was originally associated with the second mask as shown in FIG. 8. FIG. 9 also illustrates a second cluster including object 910 and object 912, both of which were originally associated with the first mask, and object 814 and object 816, both of which were originally associated with the second mask.

In the example illustrated in FIG. 9, the method or system performs a modification process to position object 918, which was originally not assigned to any mask design as indicated by its absence of any matching mask identification hatch pattern at the position indicated by 918. As the modification process moves object 918 to overlap object 904 and object 910, the method or the system may determine whether there exists a constraint that requires connected object to be printed with the same mask. If there does exist such a constraint, the method or system may associate object 920 with a mask design accordingly.

In this example illustrated in FIG. 9, the method or system maintains the mask identifications of the first cluster 902 and associates the object 920 with the second mask design, with which object 904 is also associated. In addition, the method or system may further identify a violation of the same constraint between object 920 and object 910 because, as shown in FIG. 8, object 910 was originally associated with the first mask design. The method or system may then automatically change the mask identification of object 910 to the second mask design. The method or system may then reference the second strictly connected graph or data structure for the second cluster 908 to automatically change the mask identifications of objects 912, 914, and 916 by using the information or data from the second strictly connected graph or data structure.

As it may be seen from FIG. 9, objects 910 and 912 are now associated with the second mask design, with which objects 904 and object 912 are also associated, and objects 914 and object 916 are now associated with the first mask design, as indicated by their respective hatch patterns. In some embodiments where the method or system uses a data capturing or acquisition module to acquire changes in the layout arising from the modification process at a plurality of time points, the method or the system may provide interactive or nearly real-time feedback to show that the moving object 918A is associated with the second mask design, and the changes in the mask identifications of all the objects in the second cluster 908 when the method or system first determines that the moving object overlaps object 904 and object 910 at the position indicated by 918A.

Figure 10:
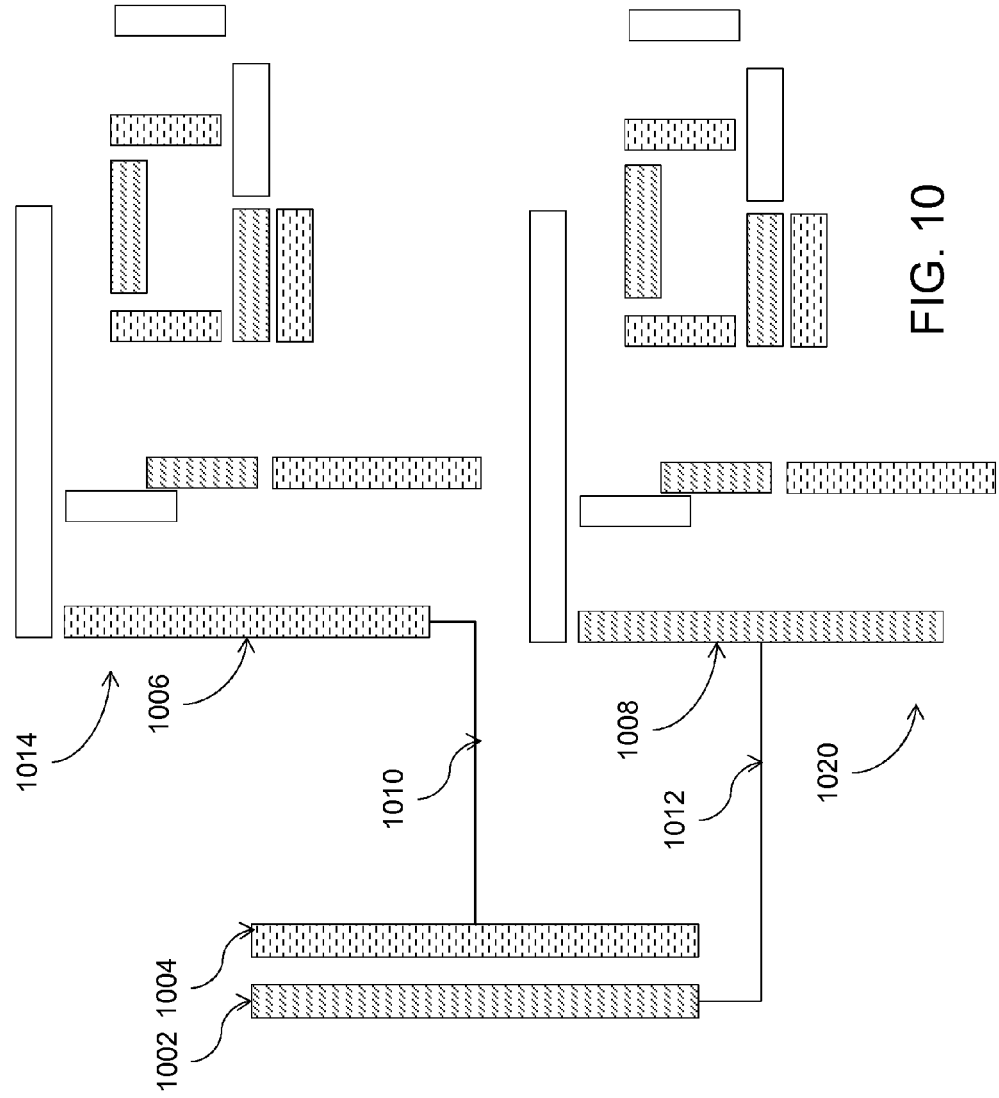
FIG. 10 illustrates an exemplary implementation of the method or system for implementing interactive coloring of physical design components in a physical electronic design with multiple-patterning techniques awareness in some embodiments.

FIG. 10 illustrates an exemplary implementation of the method or system for implementing interactive coloring of physical design components in a physical electronic design with multiple-patterning techniques awareness in some embodiments. More specifically, FIG. 10 illustrates some exemplary implementations that apply a substantially similar mask identification process to interconnects. In this example, the layout portion includes two identical instances of objects—the first instance 1014 and the second instance 1020. The first instance is connected to object 1004, which is associated with a first mask design.

The second instance is connected to object 1002, which is associated with a second mask design. The method or system may perform a modification process to route a first interconnect between object 1004 and object 1006 of the first instance. If the method or system determines that there exists a constraint that requires connected objects to be printed with the same mask, the method or system may automatically associate the first interconnect 1010 with the first mask design, with which both object 1004 and object 1006 are associated. The method or system may further perform the modification process to route the second interconnect 1012 between object 1002 and object 1008.

Regardless of whether object 1008 was originally associated with which mask design, if the method or system determines that object 1002 is required to be associated with the second mask design, the method or system automatically associates the second interconnect 1012 with the second mask design. In addition, if the method or system identifies or determines that object 1008 was not originally associated with the second mask design, the method or system may further re-associate object 1008 with the second mask design. Moreover, the method or system may reference the strictly connected graph or data structure for the second instance 1020 to make corresponding changes in the mask identifications for the objects in the second instance 1020.

Figure 11:
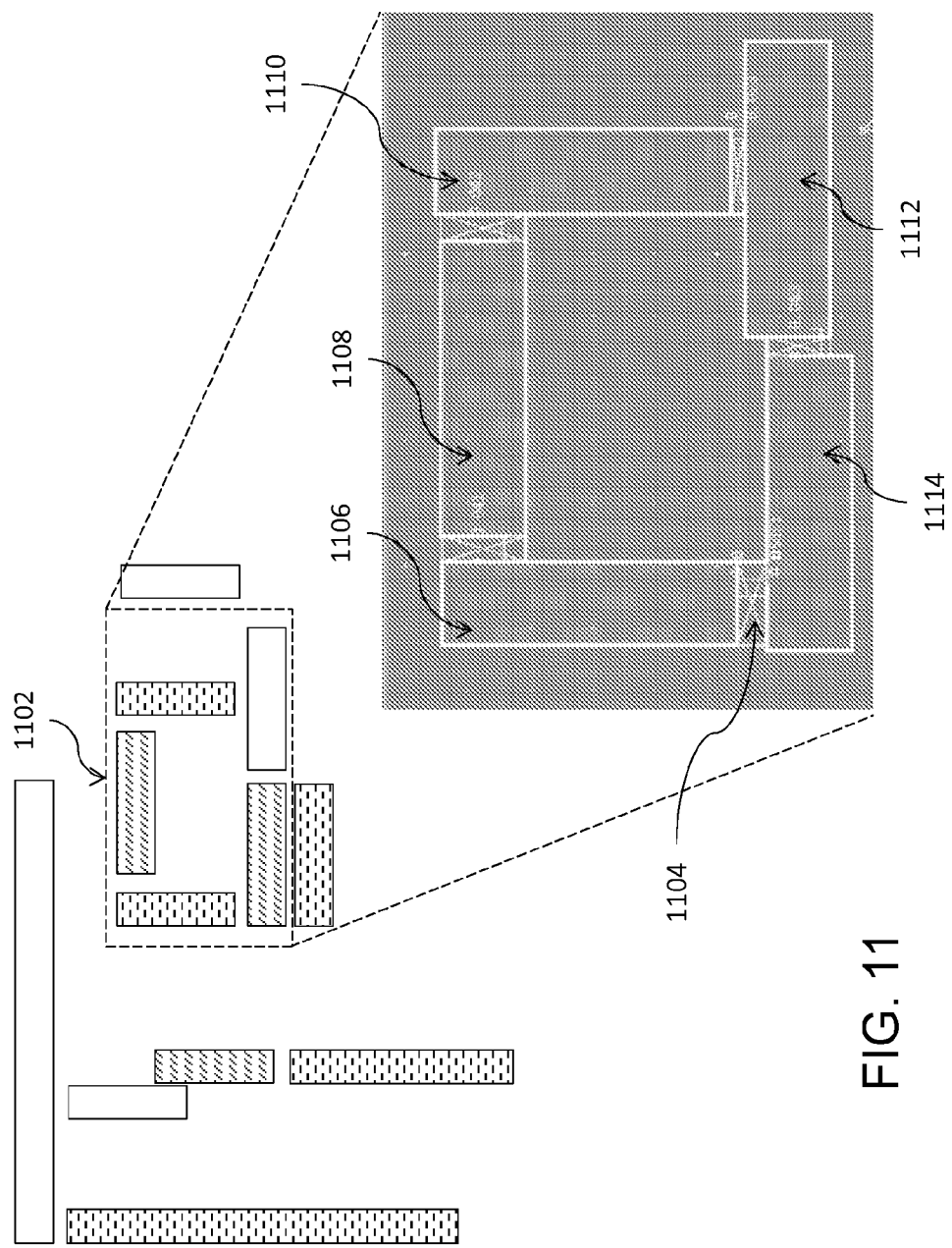
FIG. 11 illustrates an exemplary implementation of the method or system for implementing interactive coloring of physical design components in a physical electronic design with multiple-patterning techniques awareness in some embodiments.

FIG. 11 illustrates an exemplary implementation of the method or system for implementing interactive coloring of physical design components in a physical electronic design with multiple-patterning techniques awareness in some embodiments. More specifically, FIG. 11 illustrates a portion of an electronic layout that includes a loop which indicates that there exists a conflict in associating objects with corresponding mask designs. The portion of the electronic layout includes an area 1102 that includes such a loop. Area 1102 includes objects 1106, 1108, 1110, 1112, and 1114. Assuming that all the spacing values between any two adjacent objects in area 1102 are smaller than the minimum spacing value that is required between two adjacent objects in order to print these two objects with the same mask. The method may indicate each of these violations of such same mask constraint with a spacer marker 1104. The method or system may further provide textual information about the actual spacing or the required spacing for each spacer marker.

Figure 12:
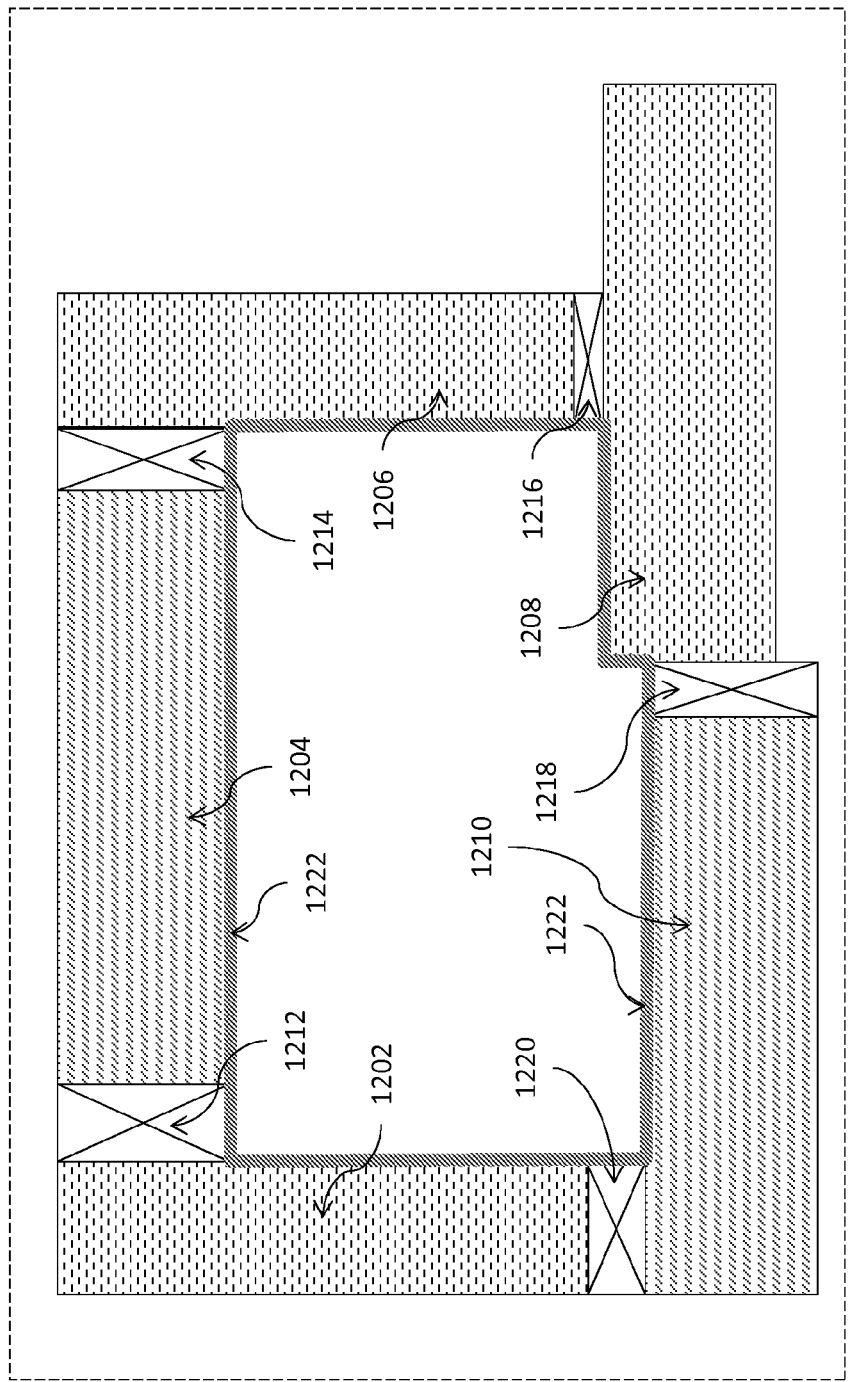
FIG. 12 illustrates an exemplary implementation of the method or system for implementing interactive coloring of physical design components in a physical electronic design with multiple-patterning techniques awareness in some embodiments.

FIG. 12 illustrates an exemplary implementation of the method or system for implementing interactive coloring of physical design components in a physical electronic design with multiple-patterning techniques awareness in some embodiments. FIG. 12 continues from FIG. 11 and illustrates the content of area 1102 in FIG. 11. More specifically, it is assuming that all the spacing values between any two adjacent objects in FIG. 12 is smaller than what is required by the same mask constraint which imposes a minimum spacing value between two adjacent objects in order to print these two adjacent objects with a same mask. These violations of the same mask constraint are indicated by the spacer markers 1212, 1214, 1216, 1218, and 1220.

If the method or system identifies or determines that object 1210 is associated with the first mask design as indicated by its unique hatch pattern, the method or system may thus associate object 1202 and object 1206 with the second mask design, and object 1204 with the first mask design. The loop occurs when the method or system tries to associate object 1208 with a mask design. With the presence of the spacer markers 1218 and 1216, the method cannot associate object 1208 with the first mask design or the second mask design and thus generates a loop marker 1222 to indicate that a mask identification conflict has been identified.

If splitting an object into multiple pieces and subsequently stitching these multiple pieces together are not permitted, this configuration results in an error that needs to be repaired by repositioning at least one of the five objects. In this situation, the ability of various processes or modules to provide interactive or nearly real-time feedback to, for example, a designer during the creation or modification of any of the five objects in this configuration will prevent this error from arising. If splitting an object into multiple pieces and subsequently stitching these multiple pieces together are actually permitted, the method may then split object 1208 into two or more pieces and associate these two or more pieces with corresponding mask designs to avoid the error.

System Architecture Overview

FIG. 7 illustrates a block diagram of an illustrative computing system 700 suitable for implementing some embodiments of the method or system for implementing electronic circuit designs with electro-migration awareness as described in the preceding paragraphs with reference to various figures. Computer system 700 includes a bus 706 or other communication mechanism for communicating information, which interconnects subsystems and devices, such as processor 707, system memory 708 (e.g., RAM), static storage device 709 (e.g., ROM), disk drive 710 (e.g., magnetic or optical), communication interface 714 (e.g., modem or Ethernet card), display 711 (e.g., CRT or LCD), input device 712 (e.g., keyboard), and cursor control (not shown).

According to one embodiment, computer system 700 performs specific operations by one or more processor or processor cores 707 executing one or more sequences of one or more instructions contained in system memory 708. Such instructions may be read into system memory 708 from another computer readable/usable storage medium, such as static storage device 709 or disk drive 710. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

Various actions or processes as described in the preceding paragraphs may be performed by using one or more processors, one or more processor cores, or combination thereof 707, where the one or more processors, one or more processor cores, or combination thereof executes one or more threads. For example, the act of specifying various net or terminal sets or the act or module of performing verification or simulation, etc. may be performed by one or more processors, one or more processor cores, or combination thereof. In one embodiment, the parasitic extraction, current solving, current density computation and current or current density verification is done in memory as layout shapes or nets are created or modified.

The term "computer readable storage medium" or "computer usable storage medium" as used herein refers to any medium that participates in providing instructions to processor 707 for execution. Such a medium may take many forms, including but not limited to, non-volatile media and volatile media. Non-volatile media includes, for example, optical or magnetic disks, such as disk drive 710. Volatile media includes dynamic memory, such as system memory 708.

Common forms of computer readable storage media includes, for example, electromechanical disk drives (such as a floppy disk, a flexible disk, or a hard disk), a flash-based, RAM-based (such as SRAM, DRAM, SDRAM, DDR, MRAM, etc.), or any other solid-state drives (SSD), magnetic tape, any other magnetic or magneto-optical medium, CD-ROM, any other optical medium, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 700. According to other embodiments of the invention, two or more computer systems 700 coupled by communication link 715 (e.g., LAN, PTSN, or wireless network) may perform the sequence of instructions required to practice the invention in coordination with one another.

Computer system 700 may transmit and receive messages, data, and instructions, including program, i.e., application code, through communication link 715 and communication interface 714. Received program code may be executed by processor 707 as it is received, and/or stored in disk drive 710, or other non-volatile storage for later execution. In an embodiment, the computer system 700 operates in conjunction with a data storage system 731, e.g., a data storage system 731 that contains a database 732 that is readily accessible by the computer system 700. The computer system 700 communicates with the data storage system 731 through a data interface 733. A data interface 733, which is coupled to the bus 706, transmits and receives electrical, electromagnetic or optical signals that include data streams representing various types of signal information, e.g., instructions, messages and data. In embodiments of the invention, the functions of the data interface 733 may be performed by the communication interface 714.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

We claim:

1. A computer implemented method for implementing interactive coloring of physical design components in a physical electronic design with multiple-patterning techniques awareness, comprising:

using at least one processor or at least one processor core to perform a process the process comprising:

identifying a schematic design view of the electronic design;

identifying an object for a modification process from a layout of the electronic design;

identifying a constraint from one or more sets of constraints, wherein the one or more sets of constraints are associated with positioning of the object in the layout; and determining a mask identification of the object based at least in part upon the constraint.

2. The computer implemented method of claim 1, in which the layout comprises a partial, incomplete physical design of the electronic design.

3. The computer implemented method of claim 1, the process further comprising:
performing the modification on the object in the layout.

4. The computer implemented method of claim 3, wherein the act of determining the mask identification is performed during a performance and before completion of the modification process.

5. The computer implemented method of claim 4, the process further comprising:
interactively displaying the mask identification or a result of whether the constraint is satisfied during the performance of the modification process.

6. The computer implemented method of claim 1, the process further comprising:
identifying a neighboring object to which the constraint applies for the object, in which the mask identification is determined based further at least in part upon an interrelation between the object and the neighboring object.

7. The computer implemented method of claim 6, in which the process further comprises:
identifying a cluster which comprises the neighboring object; and
identifying a data structure that includes information or data about one or more mask identifications for one or more objects in the cluster.

8. The computer implemented method of claim 7, the process further comprising:
determining whether the object is associated with a fixed mask identification.

9. The computer implemented method of claim 8, the process further comprising:
determining whether the one or more mask identifications of the one or more objects in the cluster is to be changed based at least in part upon the constraint.

10. The computer implemented method of claim 8, the process further comprising at least one of:
determining or identifying one or more first indicators around the neighboring object or the one or more objects of the first cluster; and
determining or identifying one or more second indicators around the object.

11. The computer implemented method of claim 8, the process further comprising:
changing at least one mask identification of the one or more mask identifications of the one or more objects in the cluster by using at least the data structure.

12. The computer implemented method of claim 11, wherein the act of changing the at least one mask identification is performed without considering the one or more sets of constraints.

13. The computer implemented method of claim 11, wherein the mask identification or the at least one mask identification is determined based at least in part upon whether object splitting and stitching is permitted.

14. The computer implemented method of claim 7, the process further comprising:
identifying another cluster including multiple objects in the layout; and
maintaining multiple mask identifications for the multiple objects in the another cluster without considering the mask identification of the object.

15. The computer implemented method of claim 1, wherein the constraint comprises a multi-valued constraint that associates multiple constraint values for different values of a characteristic associated with the object, a net-based constraint, or a connectivity information-based constraint.

16. The computer implemented method of claim 1, wherein the constraint comprises multiple requirements for multiple characteristics of the object.

17. The computer implemented method of claim 1, wherein the object comprises a geometric shape, an interconnect, or a set of multiple geometric shapes in the layout.

18. An article of manufacture comprising a non-transitory computer readable storage medium having a sequence of instructions stored thereupon which, when executed by at least one processor or at least one processor core, causes the at least one processor or the at least one processor core to perform a method for implementing interactive coloring of physical design components in a physical electronic design with multiple-patterning techniques awareness, the method comprising:
using at least one processor or at least one processor core to perform a process, the process comprising:
identifying a schematic design view of the electronic design;
identifying an object for a modification process from a layout of the electronic design;
identifying a constraint from one or more sets of constraints, wherein the one or more sets of constraints are associated with positioning of the object in the layout; and
determining a mask identification of the object based at least in part upon the constraint.

19. The article of manufacture of claim 18, the process further comprising:
performing the modification on the object in the layout.

20. The article of manufacture of claim 19, wherein the act of determining the mask identification is performed during a performance and before completion of the modification process.

21. The computer implemented method of claim 20, the process further comprising:
interactively displaying the mask identification or a result of whether the constraint is satisfied during the performance of the modification process.

22. The article of manufacture of claim 18, the process further comprising:
identifying a neighboring object to which the constraint applies for the object, in which the mask identification is determined based further at least in part upon an interrelation between the object and the neighboring object.

23. The article of manufacture of claim 22, in which the process further comprises:
identifying a cluster which comprises the neighboring object; and
identifying a data structure that includes information or data about one or more mask identifications for one or more objects in the cluster.

24. The article of manufacture of claim 23, the process further comprising:
determining whether the object is associated with a fixed mask identification.

25. The article of manufacture of claim 24, the process further comprising:
determining whether the one or more mask identifications of the one or more objects in the cluster is to be changed based at least in part upon the constraint.

26. The article of manufacture of claim 24, the process further comprising at least one of:
determining or identifying one or more first indicators around the neighboring object or the one or more objects of the first cluster; and determining or identifying one or more second indicators around the object.

27. The article of manufacture of claim 24, the process further comprising:
changing at least one mask identification of the one or more mask identifications of the one or more objects in the cluster by using at least the data structure.

28. A system for implementing interactive coloring of physical design components in a physical electronic design with multiple-patterning techniques awareness, comprising:
at least one processor or at least one processor core that is to:
identify a schematic design view of the electronic design;
identify an object for a modification process from a layout of the electronic design;
identify a constraint from one or more sets of constraints, wherein the one or more sets of constraints are associated with positioning of the object in the layout; and
determine a mask identification of the object based at least in part upon the constraint.

29. The system of claim 28, in which the at least one processor or at least one processor core is further to:
perform the modification on the object in the layout.

30. The system of claim 29, wherein the at least one processor or at least one processor core is to determine the mask identification during a performance and before completion of the modification process.

31. The system of claim 30, in which the at least one processor or at least one processor core is further to:
interactively display the mask identification or a result of whether the constraint is satisfied during the performance of the modification process.

32. The system of claim 28, in which the at least one processor or at least one processor core is further to:
identify a neighboring object to which the constraint applies for the object, in which the mask identification is determined based further at least in part upon an inter-relation between the object and the neighboring object.

33. The system of claim 32, in which the at least one processor or at least one processor core is further to:
identify a cluster which comprises the neighboring object; and
identify a data structure that includes information or data about one or more mask identifications for one or more objects in the cluster.

34. The system of claim 33, in which the at least one processor or at least one processor core is further to:
determine whether the object is associated with a fixed mask identification.

35. The system of claim 34, in which the at least one processor or at least one processor core is further to:
determine whether the one or more mask identifications of the one or more objects in the cluster is to be changed based at least in part upon the constraint.

36. The system of claim 34, in which the process at least one processor or at least one processor core is further to:
determine or identifying one or more first indicators around the neighboring object or the one or more objects of the first cluster; or
determine or identifying one or more second indicators around the object.

37. The system of claim 34, in which the at least one processor or at least one processor core is further to:
change at least one mask identification of the one or more mask identifications of the one or more objects in the cluster by using at least the data structure.

* * * * *